(12) United States Patent
Lee et al.

(10) Patent No.: US 9,601,526 B2
(45) Date of Patent: Mar. 21, 2017

(54) DISPLAY DEVICE AND MANUFACTURING METHOD THEREOF

(71) Applicant: SAMSUNG DISPLAY CO., LTD., Yongin, Gyeonggi-Do (KR)

(72) Inventors: Sun Hwa Lee, Gyeonggi-do (KR); Kwang-Chul Jung, Gyeonggi-do (KR); Tae Woo Lim, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 108 days.

(21) Appl. No.: 14/525,745

(22) Filed: Oct. 28, 2014

(65) Prior Publication Data

US 2015/0301377 A1    Oct. 22, 2015

(30) Foreign Application Priority Data

Apr. 18, 2014  (KR) .................. 10-2014-0046963

(51) Int. Cl.
| | |
|---|---|
| *G02F 1/1368* | (2006.01) |
| *H01L 27/12* | (2006.01) |
| *G02F 1/1333* | (2006.01) |
| *G02F 1/1339* | (2006.01) |
| *G02F 1/1362* | (2006.01) |

(52) U.S. Cl.
CPC ...... *H01L 27/1259* (2013.01); *G02F 1/13394* (2013.01); *G02F 1/133377* (2013.01); *G02F 1/136209* (2013.01)

(58) Field of Classification Search
CPC .............. G02F 1/133707; G02F 1/133377
See application file for complete search history.

(56) References Cited

U.S. PATENT DOCUMENTS

| | | | | |
|---|---|---|---|---|
| 5,978,062 A * | 11/1999 | Liang | ............... | G02F 1/133371 349/132 |
| 5,986,729 A * | 11/1999 | Yamanaka | ............ | G02F 1/1333 349/153 |
| 6,141,072 A * | 10/2000 | Drabik | ............... | G02F 1/13394 216/23 |
| 7,123,319 B2 * | 10/2006 | Broer | .................... | C09K 19/00 349/122 |
| 2006/0146267 A1* | 7/2006 | Choi | ................. | G02F 1/133377 349/156 |
| 2014/0198290 A1* | 7/2014 | Lim | ................. | G02F 1/133377 349/143 |

(Continued)

FOREIGN PATENT DOCUMENTS

KR    1020130084842    7/2013

*Primary Examiner* — Sang V Nguyen
(74) *Attorney, Agent, or Firm* — F. Chau & Associates, LLC

(57) ABSTRACT

A display device is provided. A substrate includes a thin film transistor. A pixel electrode is connected to the thin film transistor. A common electrode is formed on the pixel electrode. A microcavity including liquid crystal molecules is interposed between the pixel electrode and the common electrode. A roof layer is formed on the common electrode. The roof layer includes at least one protrusion. A support member is formed under the at least one protrusion and in a column shape. The support member is surrounded by the liquid crystal molecules. An overcoat is formed on the roof layer and a side of the microcavity.

20 Claims, 27 Drawing Sheets

(56) References Cited

U.S. PATENT DOCUMENTS

| | | | |
|---|---|---|---|
| 2014/0354912 A1* | 12/2014 | Lee | G02F 1/133377 349/43 |
| 2015/0049286 A1* | 2/2015 | Kim | G02F 1/133345 349/110 |
| 2015/0207097 A1* | 7/2015 | Reusch | H01L 51/0096 257/40 |
| 2015/0309357 A1* | 10/2015 | Lee | G02F 1/133377 349/43 |
| 2015/0331263 A1* | 11/2015 | Yang | G02F 1/1368 349/86 |

* cited by examiner

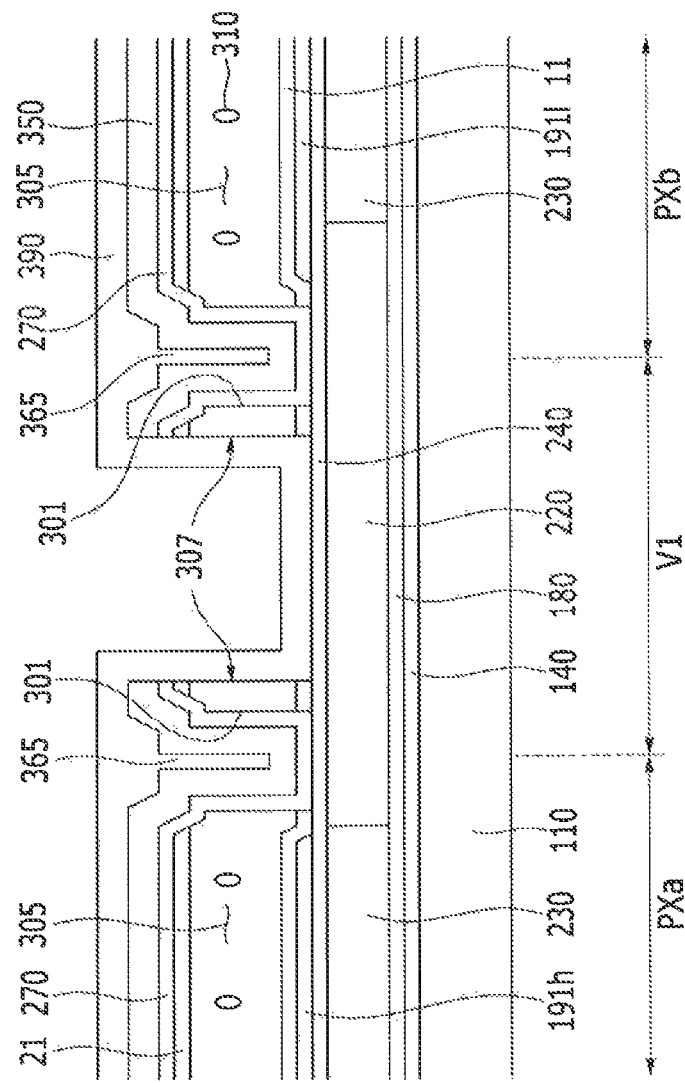

DISPLAY DEVICE AND MANUFACTURING METHOD THEREOF

CROSS-REFERENCE TO RELATED APPLICATION

This application claims priority under 35 U.S.C. §119 to Korean Patent Application No. 10-2014-0046963, filed on Apr. 18, 2014 in the Korean Intellectual Property Office, the disclosure of which is incorporated by reference herein in its entirety.

TECHNICAL FIELD

The present invention relates to a display device and a manufacturing method thereof.

DISCUSSION OF RELATED ART

Liquid crystal displays are one of flat panel displays. The liquid crystal displays include liquid crystal molecules of which alignment angles are controlled by an electric field applied to the liquid crystal molecules. Such alignment angles determine polarization of incident light so that images are generated on liquid crystal displays.

SUMMARY

According to an exemplary display device of the present invention, a substrate includes a thin film transistor. A pixel electrode is connected to the thin film transistor. A common electrode is formed on the pixel electrode. A microcavity including liquid crystal molecules is interposed between the pixel electrode and the common electrode. A roof layer is formed on the common electrode. The roof layer includes at least one protrusion. A support member is formed under the at least one protrusion and in a column shape. The support member is surrounded by the liquid crystal molecules. An overcoat is formed on the roof layer and a side of the microcavity.

According to an exemplary display device of the present invention, a plurality of first valleys extends in a first direction. A plurality of second valleys extends in a second direction crossing the first direction. A plurality of microcavities is arranged in a matrix form. Each microcavity including liquid crystal molecules is surrounded by at least one first valley and at least one second valley. A plurality of support members is arranged in the plurality of microcavities. The plurality of support members is adjacent to odd-numbered first valleys of the plurality of first valleys. A roof layer is formed on the plurality of microcavities. The roof layer is further formed in the plurality of second valleys. The roof layer is not formed in the plurality of first valley. The roof layer includes a plurality of protrusions protruding toward the odd-numbered first valleys. An overcoat is formed on the roof layer and sides of each microcavity.

According to an exemplary manufacturing method of a display device in the present invention, a thin film transistor is formed on a substrate. A pixel electrode is connected to the thin film transistor. A sacrificial layer is formed on the pixel electrode. An opening is formed by removing a part of the sacrificial layer. A common electrode is formed on the sacrificial layer. A roof layer is formed on the common electrode. A support member is formed in the opening. An injection hole is formed by patterning the roof layer so that a part of the sacrificial layer is exposed. The sacrificial layer is removed by using the patterned roof layer as a mask to form a microcavity between the pixel electrode and the common electrode. A liquid crystal layer is formed in the microcavity by injecting a liquid crystal material through the injection hole. An overcoat is formed on the roof layer to seal the microcavity. The roof layer has a protrusion which protrudes toward a region where the support member is formed.

BRIEF DESCRIPTION OF THE DRAWINGS

These and other features of the present invention will become more apparent by describing in detail exemplary embodiments thereof with reference to the accompanying drawings of which:

FIGS. 22 to 27 are process cross-sectional views for manufacturing the display device of FIGS. 9 to 15 according to an exemplary embodiment of the present invention.

DETAILED DESCRIPTION OF EXEMPLARY EMBODIMENTS

Figure 1:
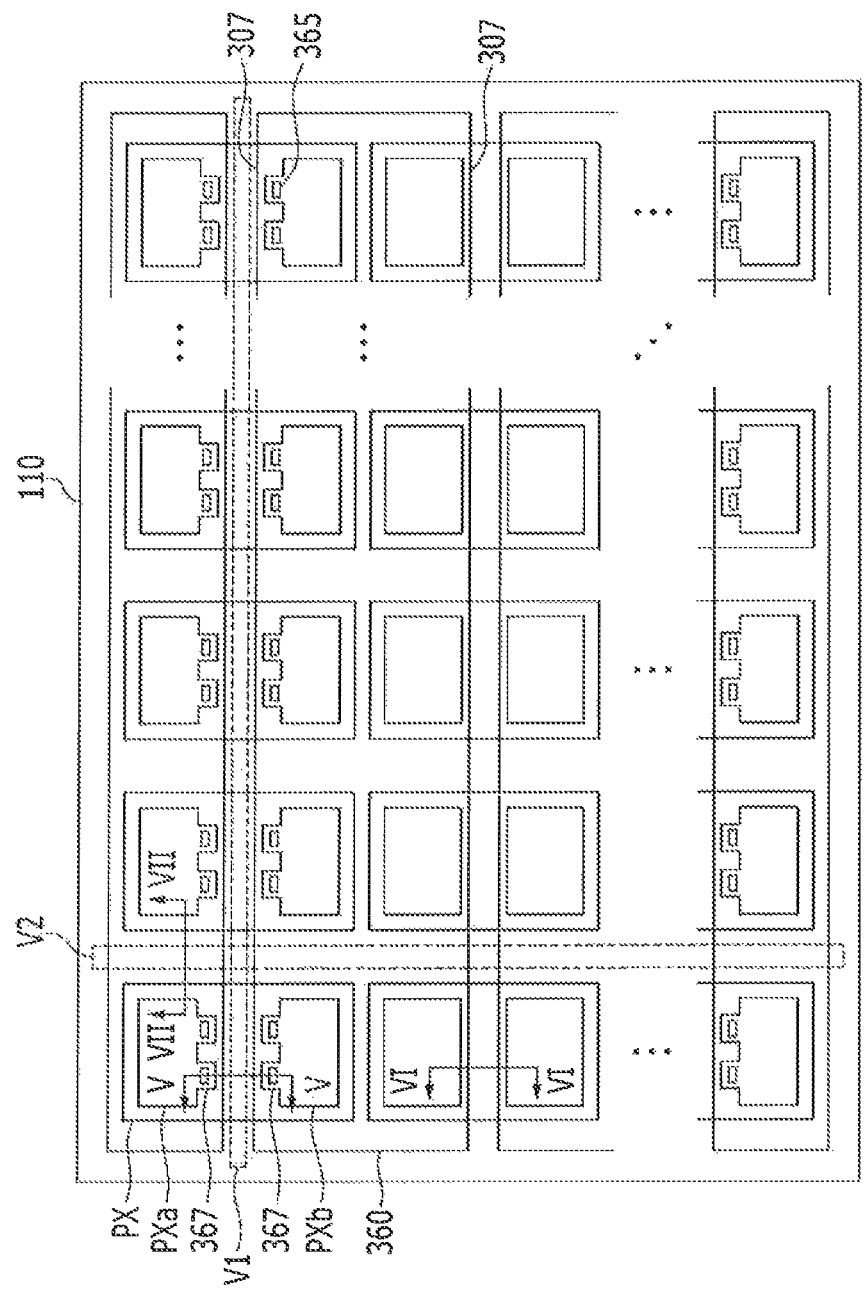
FIGS. 1 to 2 are plan views illustrating a display device according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

First, a display device according to an exemplary embodiment of the present invention will be described below with reference to the accompanying drawings.

Figure 2:
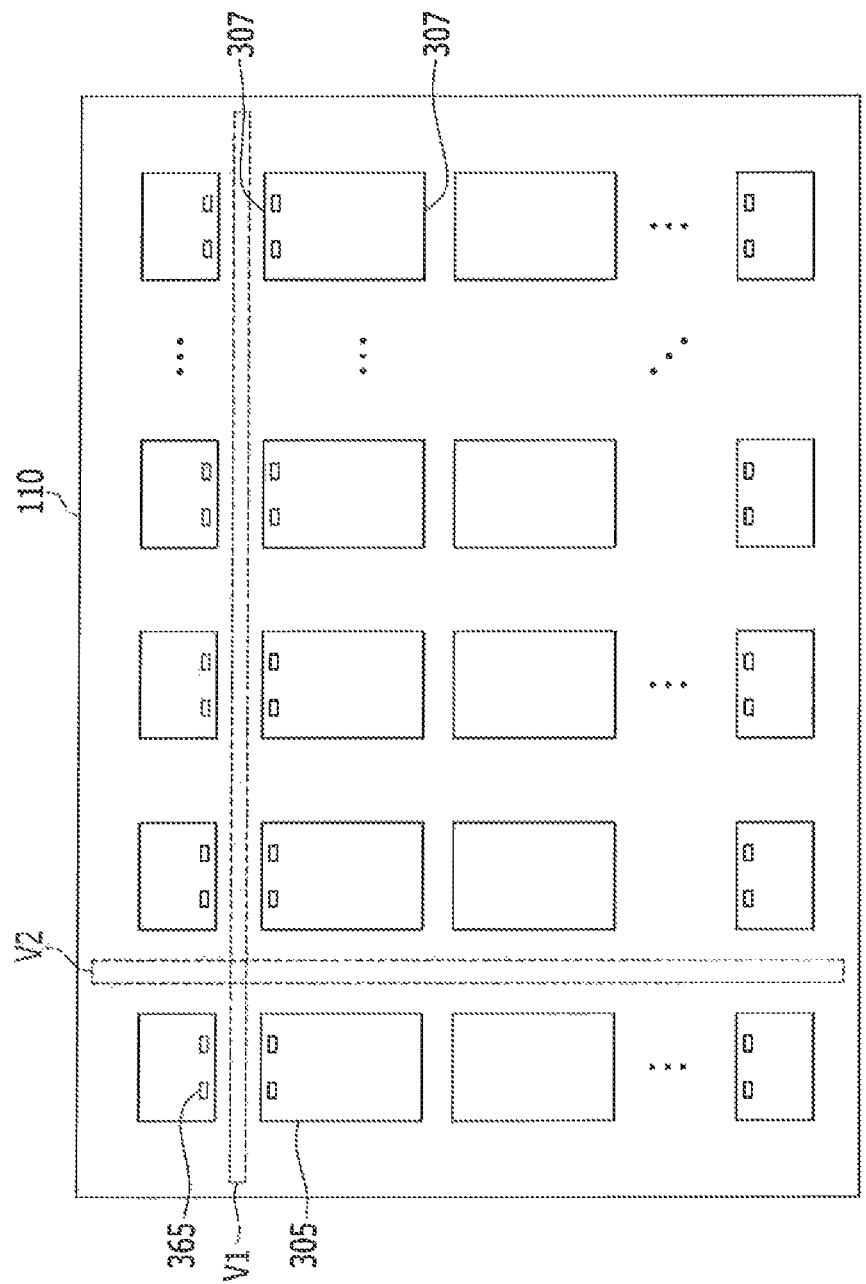

FIGS. 1 to 2 are plan views showing a display device according to an exemplary embodiment of the present invention. For the convenience of a description, FIG. 1 shows positions of support members with respect to a plurality of pixel areas, and FIG. 2 shows positions of support members with respect to a plurality of microcavities.

A display device according to an exemplary embodiment of the present invention includes a substrate 110 including a material such as glass or plastic, and a roof layer 360 formed on the substrate 110. Alternatively, the roof layer 360 may be omitted. Hereinafter, for the convenience of a description, the display device having the roof layer 360 will be described.

The substrate 110 includes a plurality of pixel areas PX. The plurality of pixel areas PX is disposed in a matrix form which includes a plurality of pixel rows and a plurality of pixel columns. Each pixel area PX includes a first subpixel area PXa and a second subpixel area PXb. The first subpixel area PXa and the second subpixel area PXb may be arranged in a pixel column direction.

A first valley V1 is positioned between the first subpixel area PXa and the second subpixel area PXb and is extended in a pixel row direction crossing the pixel column direction. A second valley V2 is positioned between two adjacent pixel columns of a plurality of pixel columns. The second valley V2 is extended in the column direction.

The roof layer 360 is formed along the plurality of pixel rows. In this case, an injection hole 307 is connected to the first valley V1 so that the microcavity 305 covered by the roof layer 360 is exposed outside by removing the roof layer 360.

Each of the first subpixel area PXa and the second subpixel area PXb may include one injection hole 307. For example, the injection hole 307 is formed in a lower side of the first subpixel area PXa, the injection hole 307 is formed in an upper side of the second subpixel area PXb, and thus the two injection holes 307 face each other.

A support member 365 is formed to be adjacent to the injection hole 307 below the roof layer 360. A microcavity 305 is formed below the roof layer 360. The support member 365 is adjacent to the injection hole 307 to support the roof layer 360, and thus may prevent the roof layer 360 from being sagged down around the injection hole 307.

One or two or more support members 365 may be formed to support the roof layer 360. In FIG. 1, each of the first subpixel area PXa and the second subpixel area PXb includes the same number of the support members 365. The present invention is not limited thereto, and the number of the support members 365 may be different between microcavities 305 facing each other across the first valley V1. For example, one support member 365 may be formed in the first subpixel area PXa, and two support members 365 may be formed in the second subpixel area PXb. The reverse case thereof is possible.

Referring to FIG. 1, the roof layer 360 protrudes to be disposed on the support member 365. For example, the roof layer 360 has a protrusion 367 protruding to a region where the support member 365 is formed. Accordingly, the roof layer 360 may include at least one protrusion 367 at the side where the support member 365 is formed. The number of the protrusions 367 is the same as that of the support members 365. The roof layer 360 is formed to protrude along the support member 365, and as a result, structural stability is increased. Since the roof layer 360 protrudes only in the region where the support member 365 is formed, the reduction of the aperture ratio may be minimized. Detailed structure and effects will be described below.

The support members 365 disposed under different roof layer 360 face each other across the first valley V1. The plurality of microcavities 305 is disposed in a matrix form which includes a plurality of pixel rows and a plurality of pixel columns. For example, the microcavity 305 may have a quadrangular shape, and a lower edge of the microcavity 305 in a first row and an upper edge of the microcavity 305 in a second row face each other across the first valley V1. In this case, the support members 365 are formed at the lower edge of the microcavity 305 in the first row and the upper edge of the microcavity 305 in the second row. Accordingly, the support members 365 face each other across the first valley V1.

The injection holes 307 disposed under different roof layers 360 face each other across the first valley V1. For example, the injection holes 307 may be formed at the lower edge of the microcavity 305 in the first row and the upper edge of the microcavity 305 in the second row. In this case, the support member 365 is adjacent to the injection hole 307. Further, the support member 365 need not be formed at the opposite edges of the microcavity 305. For example, if the support member 365 is formed at a lower edge of the microcavity 305 in an odd-numbered row, the support member 365 need not be formed at an upper edge. Further, if the support member 365 is formed at an upper edge of the microcavity 305 in an even-numbered row, the support member 365 need not be formed at a lower edge. The present invention is not limited thereto. For example, the reverse case thereof may be possible.

The first valley V1 is formed between the microcavities 305 positioned in different rows. The support member 365 is adjacent to both sides of the first valley V1. The support member 365 is adjacent to one first valley V1 of the odd-numbered first valley V1 and the even-numbered first valley V1, but is not formed to be adjacent to the other first valley V1 thereof. For example, the support member 365 is formed to be adjacent to both sides of a first valley V1, but is not formed to be adjacent to both sides of a second first valley V1.

Hereinabove, the case where one microcavity 305 is formed throughout the first subpixel area PXa and the second subpixel area PXb of the two adjacent pixel areas PX is described, but the present invention is not limited thereto. For example, one microcavity 305 may be formed in one pixel area PX.

Next, a display device according to an exemplary embodiment of the present invention will be described below with reference to FIGS. 1 to 7.

Figure 3:
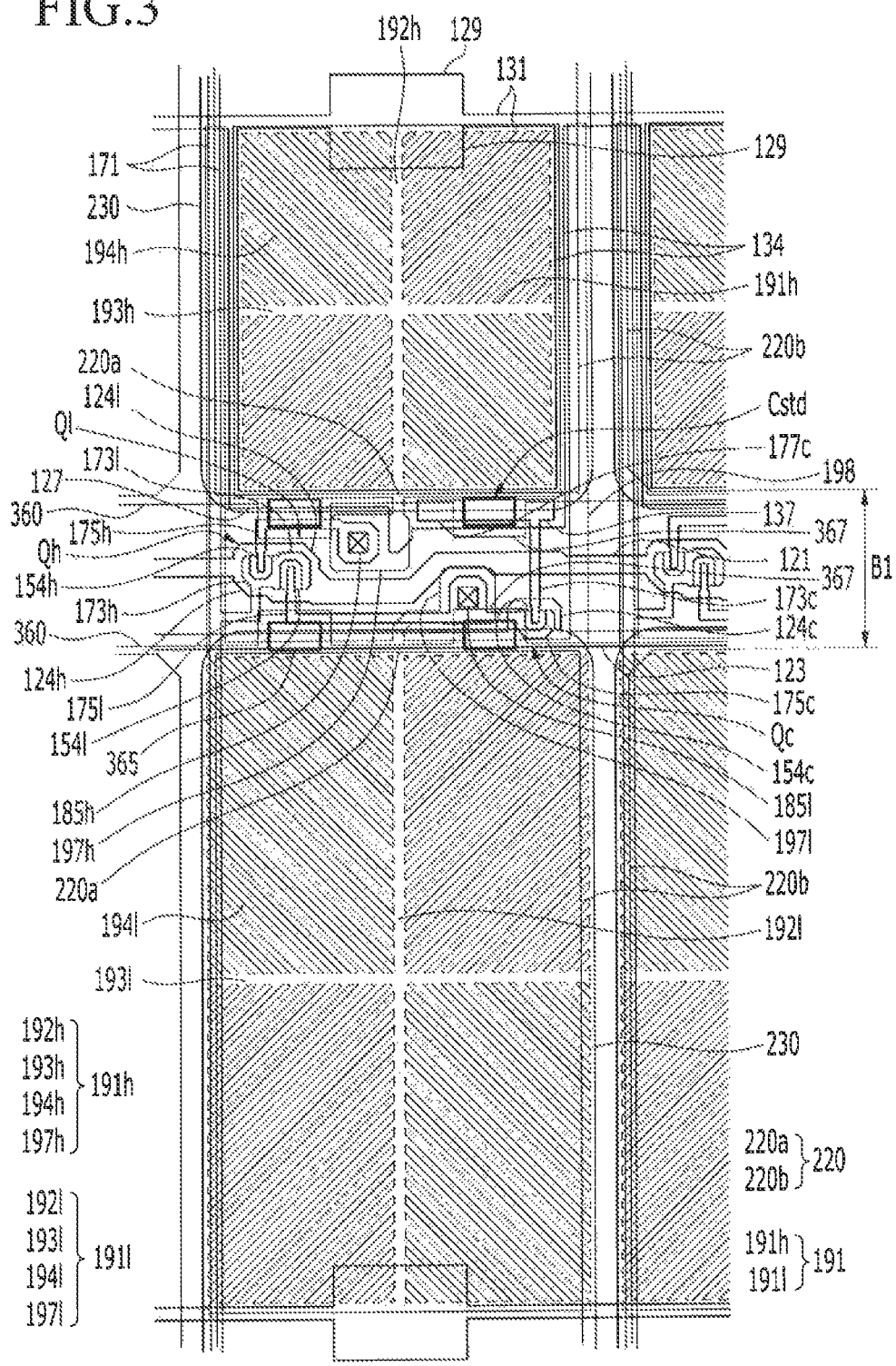
FIG. 3 is a plan view illustrating one pixel of a display device according to an exemplary embodiment of the present invention.
Figure 4:
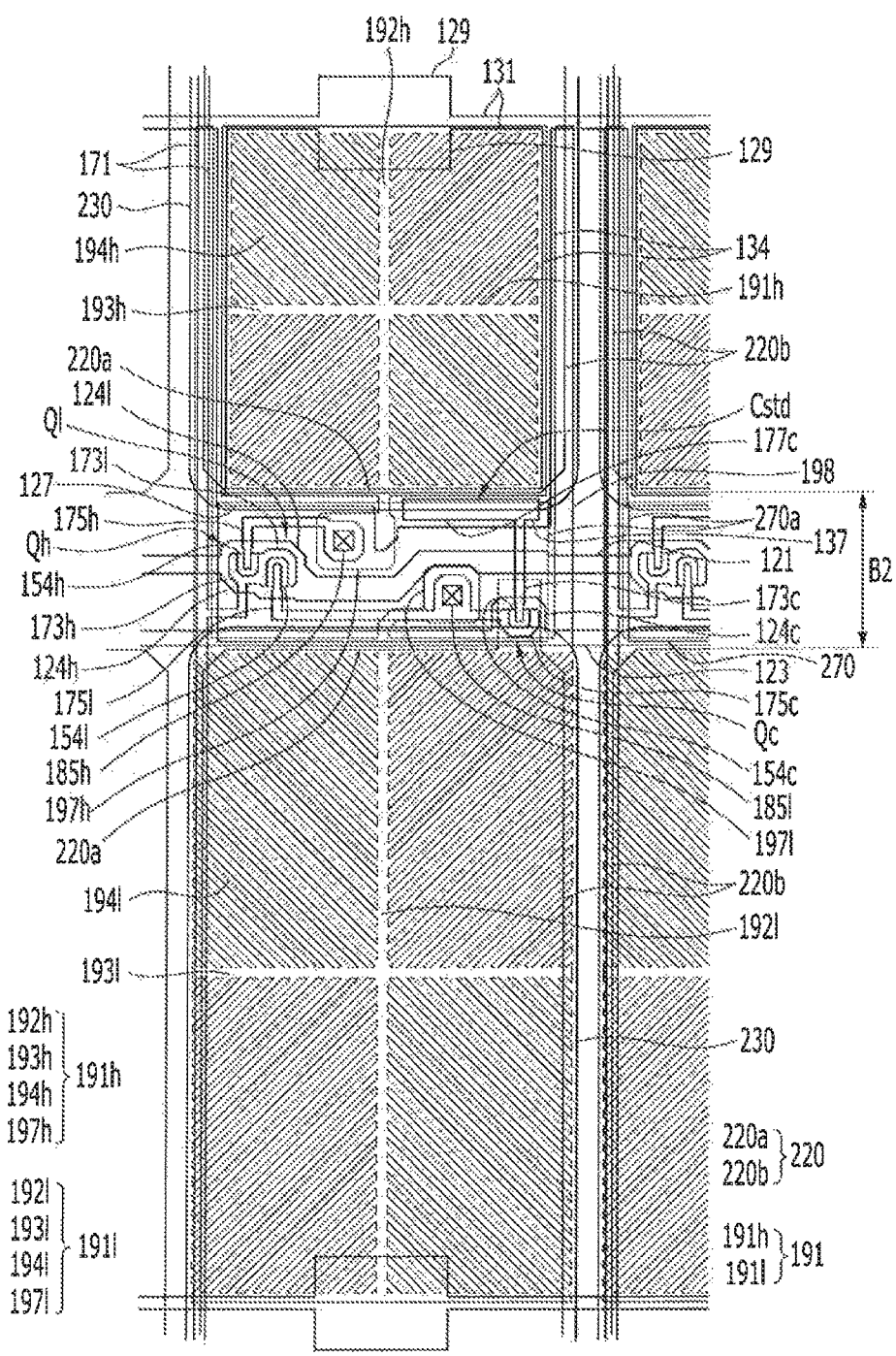
FIG. 4 is a plan view illustrating one pixel of a display device according to an exemplary embodiment of the present invention.
Figure 5:
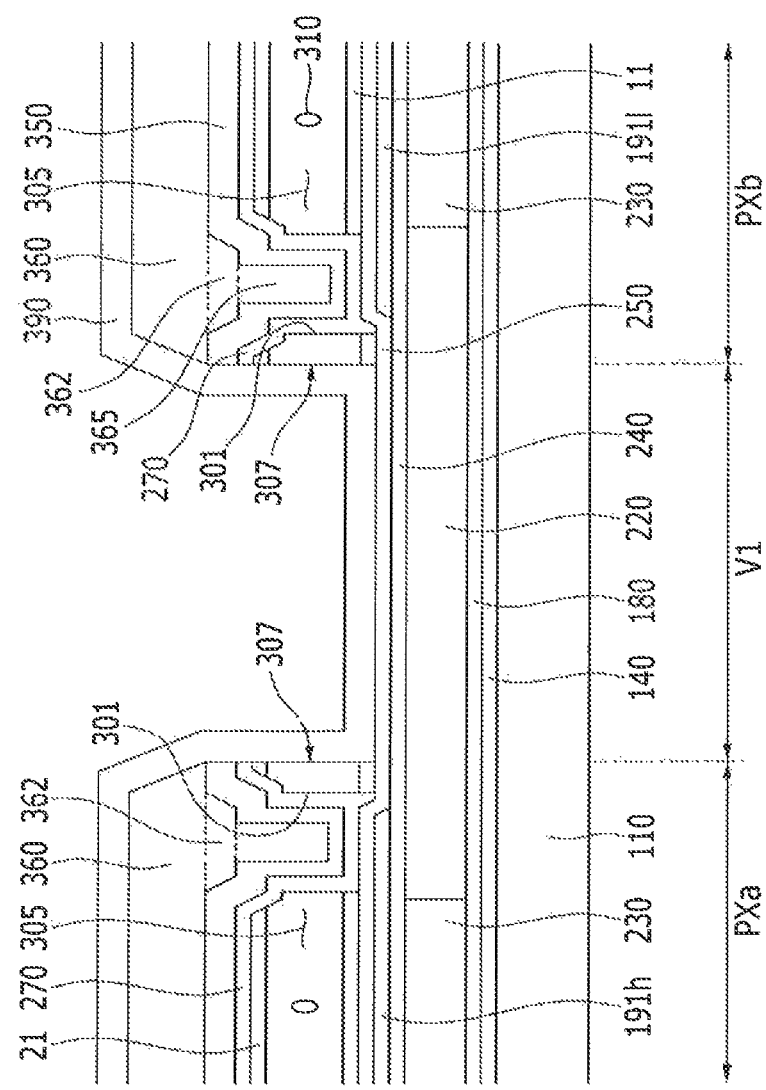
FIG. 5 is a cross-sectional view illustrating a part of the display device of FIG. 1 taken along line V-V according to an exemplary embodiment of the present invention.
Figure 6:
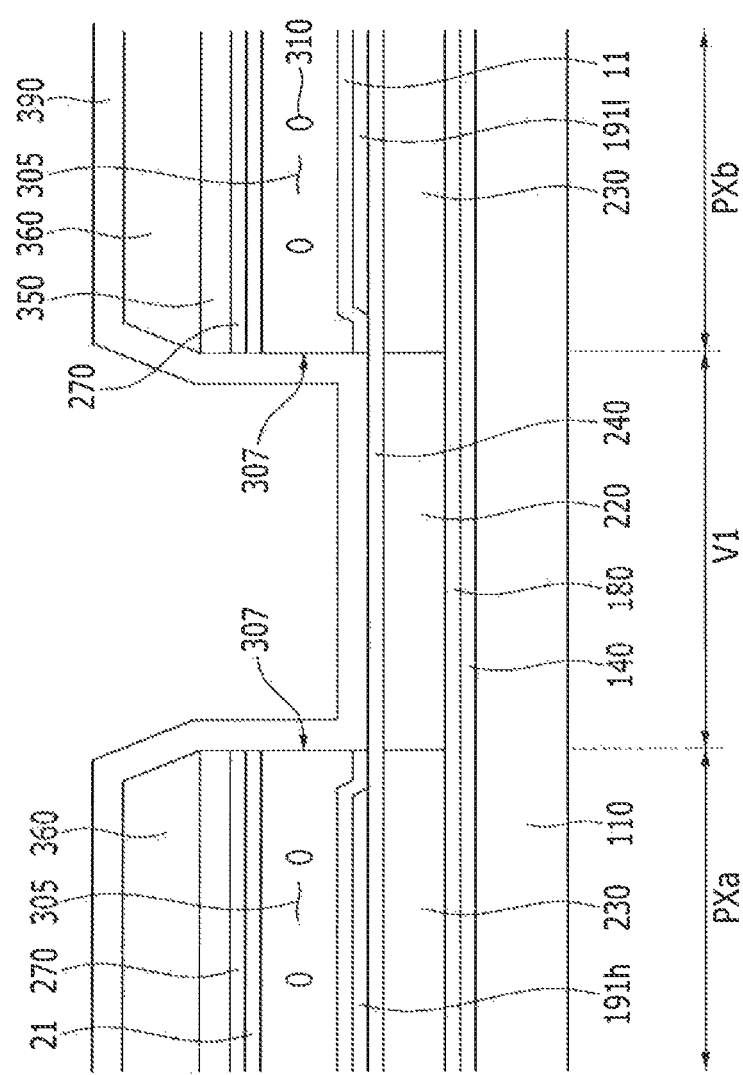
FIG. 6 is a cross-sectional view illustrating a part of the display device of FIG. 1 taken along line VI-VI according to an exemplary embodiment of the present invention.
Figure 7:
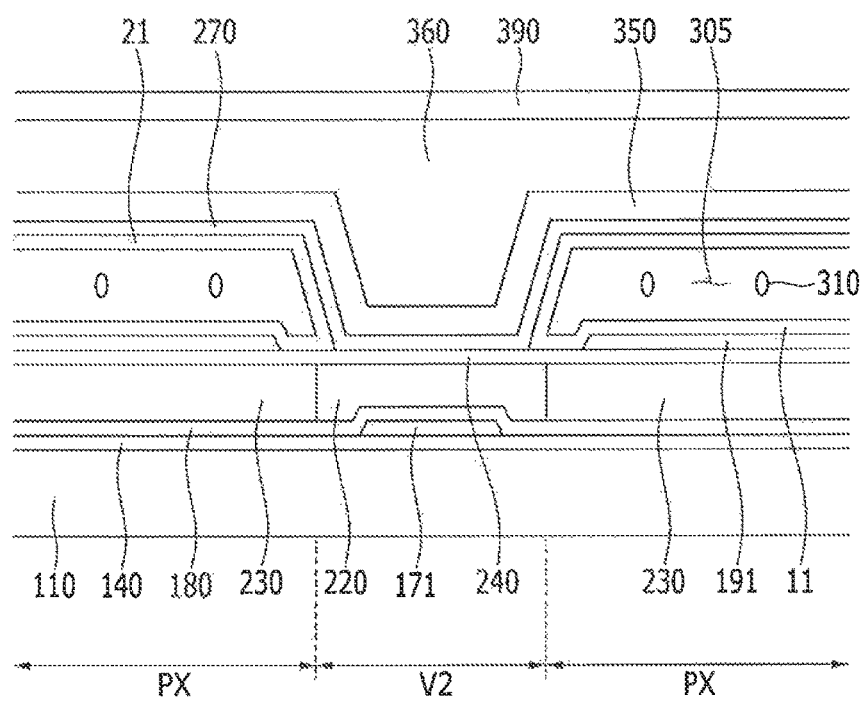
FIG. 7 is a cross-sectional view illustrating a part of the display device of FIG. 1 taken along line VII-VII according to an exemplary embodiment of the present invention.

FIG. 3 is a plan view illustrating one pixel of a display device according to an exemplary embodiment of the present invention. FIG. 4 is a plan view illustrating one pixel of a display device according to an exemplary embodiment of the present invention. FIG. 5 is a cross-sectional view taken along line V-V of the display device of FIG. 1. FIG. 6 is a cross-sectional view taken along line VI-VI of the display device of FIG. 1. FIG. 7 is a cross-sectional view taken along line VII-VII of the display device of FIG. 1.

FIGS. 3 and 5 illustrate pixels with the support members, and FIGS. 4 and 6 illustrate pixels without the support members. For example, FIGS. 3 and 5 illustrate an odd-numbered first valley V1 and subpixels adjacent thereto, and FIGS. 4 and 6 illustrate an even-numbered first valley V1 and subpixels adjacent thereto.

Referring to FIGS. 1 to 7, a plurality of gate conductors including a plurality of gate lines 121, a plurality of step-down gate lines 123, and a plurality of storage electrode lines 131 are formed on the substrate 110.

The gate line 121 and the step-down gate line 123 mainly extend in a horizontal direction to transfer gate signals. The gate conductor further includes a first gate electrode 124h and a second gate electrode 124l protruding upward and downward from the gate line 121, and further includes a third gate electrode 124c protruding upward from the step-down gate line 123. The first gate electrode 124h and the second gate electrode 124l are connected to each other to form one protrusion. In an exemplary embodiment, the protruding form of the first, second, and third gate electrodes 124h, 124l, and 124c may be modified.

The storage electrode line 131 mainly extends in a horizontal direction and transfers a predetermined voltage such as a common voltage Vcom. The storage electrode line 131 includes storage electrodes 129 protruding upward and downward, a pair of vertical portions 134 extending downward to be substantially vertical to the gate line 121, and a horizontal portion 127 connecting ends of the pair of vertical portions 134. The horizontal portion 127 includes a capacitor electrode 137 extended downward.

A gate insulating layer 140 is formed on the gate conductor 121, 123, 124h, 124l, 124c, and 131. The gate insulating layer 140 may include an inorganic insulating material such as silicon nitride (SiNx) and silicon oxide (SiOx). Further, the gate insulating layer 140 may be formed in a single layer or a multilayer.

A first semiconductor 154h, a second semiconductor 154l, and a third semiconductor 154c are formed on the gate insulating layer 140. The first semiconductor 154h is positioned on the first gate electrode 124h, the second semiconductor 154l is positioned on the second gate electrode 124I, and the third semiconductor 154c is positioned on the third gate electrode 124c. The first semiconductor 154h and the second semiconductor 154l are connected to each other, and the second semiconductor 154l and the third semiconductor 154c are connected to each other. Further, the first semiconductor 154h is extended to the lower portion of the data line 171. The first to third semiconductors 154h, 154l, and 154c may include amorphous silicon, polycrystalline silicon, metal oxide, and the like.

An ohmic contact (not illustrated) may be further formed on each of the first to third semiconductors 154h, 154l, and 154c. The ohmic contact may include silicide or a material such as n+ hydrogenated amorphous silicon in which n-type impurity is doped at a high concentration.

A data conductor including a data line 171, a first source electrode 173h, a second source electrode 173l, a third source electrode 173c, a first drain electrode 175h, a second drain electrode 175l, and a third drain electrode 175c is formed on the first to third semiconductors 154h, 154l, and 154c.

The data line 171 transfers a data signal and mainly extends in a vertical direction to cross the gate line 121 and the step-down gate line 123. Each data line 171 extends toward the first gate electrode 124h and the second gate electrode 124l and includes a first source electrode 173h and a second source electrode 173l which are connected to each other.

Each of the first drain electrode 175h, the second drain electrode 175I, and the third drain electrode 175c includes one wide end portion and the other rod-shaped end portion. The rod-shaped end portions of the first drain electrode 175h and the second drain electrode 175l are partially surrounded by the first source electrode 173h and the second source electrode 173l, respectively. One wide end portion of the second drain electrode 175l is extended to form a third source electrode 173c which is bent in a 'U'-lettered shape. A wide end portion 177c of the third drain electrode 175c overlaps the capacitive electrode 137 to form a step-down capacitor Cstd, and the rod-shaped end portion is partially surrounded by the third source electrode 173c.

The first gate electrode 124h, the first source electrode 173h, and the first drain electrode 175h form a first thin film transistor Qh together with the first semiconductor 154h, the second gate electrode 124I, the second source electrode 173I, and the second drain electrode 175I form a second thin film transistor QI together with the second semiconductor 154I, and the third gate electrode 124c, the third source electrode 173c, and the third drain electrode 175c form the third thin film transistor Qc together with the third semiconductor 154c.

The first semiconductor 154h, the second semiconductor 154T, and the third semiconductor 154c are connected to each other to be formed in a linear shape. The semiconductor 154h, 154I and 154c may have substantially the same planar shape as the data conductor 171, 173h, 173I, 173c, 175h, 175I, and 175c and the ohmic contacts therebelow, except for channel regions between the source electrodes 173h, 173T, and 173c and the drain electrodes 175h, 175I, and 175c.

In the first semiconductor 154h, an exposed portion which is not covered by the first source electrode 173h and the first drain electrode 175h is disposed between the first source electrode 173h and the first drain electrode 175h. In the second semiconductor 154I, an exposed portion which is not covered by the second source electrode 173I and the second drain electrode 175I is disposed between the second source electrode 173I and the second drain electrode 175I. In addition, in the third semiconductor 154c, an exposed portion which is not covered by the third source electrode 173c and the third drain electrode 175c is disposed between the third source electrode 173c and the third drain electrode 175c.

A passivation layer 180 is formed on the data conductor 171, 173h, 173l, 173c, 175h, 175l, and 175c and the semiconductors 154h, 154I, and 154c exposed between the respective source electrodes 173h/173l/173c and the respective drain electrodes 175h/175l/175c. The passivation layer 180 may include an organic insulating material or an inorganic insulating material, and may be formed as a single layer or a multilayer.

A color filter 230 in each pixel area PX is formed on the passivation layer 180. Each color filter 230 may display one of the primary colors such as three primary colors of red, green and blue. The color filter 230 is not limited to the three primary colors of red, green and blue, and may display cyan, magenta, yellow, and white-based colors. Unlike those illustrated above, the color filter 230 may be elongated in a column direction along a space between the adjacent data lines 171.

A light blocking member 220 is formed in a region between two adjacent color filters 230. The light blocking member 220 is formed to be overlapped with a boundary of the pixel area PX, the thin film transistor, and the support member 365 to prevent light leakage. The color filter 230 is formed in each of the first subpixel area PXa and the second subpixel area PXb, and the light blocking member 220 may be formed between the first subpixel area PXa and the second subpixel area PXb.

The light blocking member 220 includes a horizontal light blocking member 220a and a vertical light blocking member 220b. The horizontal light blocking member 220a extends along the gate line 121 and the step-down gate line 123 to cover regions in which the first thin film transistor Qh, the second thin film transistor Ql, and the third thin film transistor Qc are positioned. The vertical light blocking member 220b extends along the data line 171. For example, the horizontal light blocking member 220a may be formed in the first valley V1, and the vertical light blocking member 220b may be formed in the second valley V2. The color filter 230 and the light blocking member 220 may overlap with each other in a partial region.

A first insulating layer 240 is formed on the color filter 230 and the light blocking member 220. The first insulating layer 240 may include an inorganic insulating material such as silicon nitride (SiNx) and silicon oxide (SiOx). The first insulating layer 240 serves to protect the color filter 230 having an organic material and the light blocking member 220. Alternatively, the first insulating layer 240 may be omitted.

In the first insulating layer 240, the light blocking member 220, and the passivation layer 180, a plurality of first contact holes 185h and a plurality of second contact holes 185l, which expose the wide end portion of the first drain electrode 175h and the wide end portion of the second drain electrode 175l, respectively, are formed.

A pixel electrode 191 is formed on the first insulating layer 240. The pixel electrode 191 may include a transparent metal material such as indium tin oxide (ITO) and indium zinc oxide (IZO).

The pixel electrode 191 includes a first subpixel electrode 191h and a second subpixel electrode 191l which are separated from each other with the gate line 121 and the step-down gate line 123 therebetween, and disposed above and below the pixel area PX based on the gate line 121 and the step-down gate line 123 to be adjacent to each other in a column direction. For example, the first subpixel electrode 191h and the second subpixel electrode 191l are separated from each other with the first valley V1 therebetween, the first subpixel electrode 191h is positioned in the first subpixel area PXa, and the second subpixel electrode 191l is positioned in the second subpixel area PXb.

The first subpixel electrode 191h and the second subpixel electrode 191l are connected to the first drain electrode 175h and the second drain electrode 175l through the first contact hole 185h and the second contact hole 185l, respectively. Accordingly, when the first thin film transistor Qh and the second thin film transistor Ql are turned on, the first subpixel electrode 191h and the second subpixel electrode 191l receive data voltages from the first drain electrode 175h and the second drain electrode 175l.

An overall shape of each of the first subpixel electrode 191h and the second subpixel electrode 191l is a quadrangle. The first subpixel electrode 191h and the second subpixel electrode 191l include cross stems including horizontal stems 193h and 193l and vertical stems 192h and 192l crossing the horizontal stems 193h and 193l, respectively. Further, the first subpixel electrode 191h and the second subpixel electrode 191l include a plurality of minute branches 194h and 194l, and protrusions 197h and 197l protruding downward or upward from edge sides of the subpixel electrodes 191h and 191l, respectively.

The pixel electrode 191 is divided into four subregions by the horizontal stems 193h and 193l and the vertical stems 192h and 192l. The minute branches 194h and 194l obliquely extend from the horizontal stems 193h and 193l and the vertical stems 192h and 192l, and the extending direction may form an angle of approximately 45 degrees or 135 degrees with the gate line 121 or the horizontal stems 193h and 193l. Further, extending directions of the minute branches 194h and 194l of the two adjacent subregions may be substantially perpendicular to each other.

The first subpixel electrode 191h further includes an outer stem surrounding the outside. The second subpixel electrode 191l further includes horizontal portions positioned at an upper end and a lower end, and left and right vertical portions 198 positioned at the left and the right of the first subpixel electrode 191h. The left and right vertical portions 198 may prevent capacitive coupling between the data line 171 and the first subpixel electrode 191h.

The layout form of the pixel area, the structure of the thin film transistor, and the shape of the pixel electrode described above are an exemplary embodiment of the present invention. The present invention is not limited thereto, and such exemplary embodiment may be variously modified according to the present invention.

The common electrode 270 is spaced apart from the pixel electrode 191 at a predetermined distance. The microcavity 305 is formed between the pixel electrode 191 and the common electrode 270. For example, the microcavity 305 is surrounded by the pixel electrode 191 and the common electrode 270. A width and an area of the microcavity 305 may be variously modified according to a size and a resolution of an exemplary display device of the present invention.

The pixel electrode 191 and the common electrode 270 do not overlap each other. Accordingly, a short-circuit between the pixel electrode 191 and the common electrode 270 may be prevented without forming an insulating layer therebetween. Accordingly, a manufacturing process is simplified, and the number of masks used may be reduced.

The common electrode 270 may include a transparent metal material such as indium tin oxide (ITO) and indium zinc oxide (IZO). A predetermined voltage may be applied to the common electrode 270, and an electric field may be generated between the pixel electrode 191 and the common electrode 270.

A first alignment layer 11 is formed on the pixel electrode 191.

A second alignment layer 21 is formed on the common electrode 270, facing the first alignment layer 11.

The first alignment layer 11 and the second alignment layer 21 may be formed using vertical alignment layers. The alignment layers 11 and 21 may include an alignment material such as polyamic acid, polysiloxane, and polyimide. The first and second alignment layers 11 and 21 may be connected to each other at an edge of the pixel area PX.

A liquid crystal layer having liquid crystal molecules 310 is formed in the microcavity 305. The microcavity 305 is positioned between the pixel electrode 191 and the common electrode 270. The liquid crystal molecules 310 have negative dielectric anisotropy, and may are aligned in a vertical direction to the substrate 110 while an electric field is not applied to the liquid crystal layer. For example, vertical alignment may occur.

The first subpixel electrode 191*h* and the second subpixel electrode 191*l* to which the data voltages are applied generate an electric field together with the common electrode 270 to rotate the liquid crystal molecules 310 positioned in the microcavity 305 between the two electrodes 191 and 270. Luminance of light passing through the liquid crystal layer varies according to the rotation angle of the liquid crystal molecules 310.

A second insulating layer 350 is formed on the common electrode 270. The second insulating layer 350 may include an inorganic insulating material such as silicon nitride (SiNx) and silicon oxide (SiOx). Alternatively, the second insulating layer 350 may be omitted.

A roof layer 360 is formed on the second insulating layer 350. The roof layer 360 may include an organic material.

For example, since the second insulating layer 350 may include an inorganic insulating layer and the roof layer 360 may include an organic material, a double layer of an inorganic layer and an organic layer is formed on the common electrode.

In an exemplary embodiment, the roof layer 360 may be omitted. In this case, the second insulating layer 350 may serve as the roof layer. The thickness of the second insulating layer 350 may be greater than would be the case if the roof layer 360 is used. A detailed description therefor will be described below. However, in the case where the roof layer 360 is omitted and the second insulating layer 350 functions as the roof layer, a description for the roof layer 360 below is applied to the second insulating layer 350. If the roof layer 360 is omitted, the second insulating layer 350 may be referred to as a roof layer.

The microcavity 305 is formed below the roof layer 360, and the roof layer 360 is hardened by a curing process to maintain the shape of the microcavity 305. The roof layer 360 is spaced apart from the pixel electrode 191 with the microcavity 305 therebetween.

The roof layer 360 is formed in each pixel area PX along a pixel row and the second valley V2, and is not formed in the first valley V1. For example, the roof layer 360 is not formed between the first subpixel area PXa and the second subpixel area PXb. The microcavity 305 is formed below each roof layer 360 at each of the first subpixel area PXa and the second subpixel area PXb. In the second valley V2, the microcavity 305 is not formed below the roof layer 360, but formed to be attached to the substrate 110. Accordingly, a thickness of the roof layer 360 positioned at the second valley V2 may be larger than a thickness of the roof layer 360 positioned at each of the first subpixel area PXa and the second subpixel area PXb. The upper surface and both sides of the microcavity 305 are covered by the roof layer 360.

An injection hole 307 exposing a part of the microcavity 305 is formed in the roof layer 360. The injection holes 307 face each other at the edges of the first subpixel area PXa and the second subpixel area PXb as described above. For example, one of the two facing injection holes 307 correspond to the lower side of the first subpixel area PXa and the other corresponds to the upper side of the second subpixel area PXb to expose the side of the microcavity 305. Further, the two adjacent injection holes 307 formed at two edges of each microcavity 305 face each other.

Since the microcavity 305 is exposed by the injection hole 307, an aligning agent, a liquid crystal material, or the like may be injected into the microcavity 305 through the injection hole 307.

The support member 365 is adjacent to the injection hole 307 to have a column shape in the microcavity 305. The support member 365 is formed at each of the edges of two different microcavities 305 facing each other, as illustrated in FIGS. 3 and 5.

Two injection holes 307 are formed in one microcavity 305. For example, respective injection holes 307 are positioned on an upper edge and a lower edge of one microcavity 305. The support member 365 is formed only in one of the two edges of the microcavity 305. For example, the support member 365 is adjacent to the injection hole 307 positioned at the upper edge of the microcavity 305. In this case, the support member 365 is not formed at a position which is adjacent to the injection hole 307 positioned at the lower edge of the microcavity 305.

The support member 365 is adjacent to both sides of the odd-numbered first valley V1 as illustrated in FIGS. 1, 2, and 5, and is not formed to be adjacent to both sides of the even-numbered first valley V1 as illustrated in FIGS. 1, 2, and 6. Further, the present invention is not limited thereto, and the support member 365 may be formed to be adjacent to both sides of the even-numbered first valley V1, but need not be formed to be adjacent to both sides of the odd-numbered first valley V1.

The first alignment layer 11 and the second alignment layer 21 may be formed by injecting the aligning agent, and solids are concentrated at one place of the aligning agent during a drying process of the aligning agent, and as a result, an agglomeration phenomenon of the alignment layer occurs. Since the support member 365 is adjacent to the injection hole 307 positioned at one edge of the microcavity 305, capillary forces in the two injection holes 307 formed in one microcavity 305 are different from each other. Since the capillary force in the injection hole 307 with the support member 365 is relatively large, the agglomeration phenomenon of the alignment layer occurs around the injection hole 307 with the support member 365. As such, at the point where the agglomeration phenomenon of the alignment layer occurs, light may not be transmitted well, and as a result, a screen may not be displayed well. In the display device according to the exemplary embodiment of the present invention, the agglomeration phenomenon of the alignment layer may occur at the edge of the first subpixel area PXa or the second subpixel area PXb. Further, since the light blocking member 220 is formed to be overlapped with the support member 365, the agglomeration phenomenon of the alignment layer may be prevented from being recognized as a defect. Since an area of forming the light blocking member 220 may be reduced as the support member 365 is formed to be closer to the injection hole 307, an aperture ratio may be further increased.

The sagging phenomenon of the roof layer 360 may occur at a place where the agglomeration phenomenon of the alignment layer occurs. Since the support member 365 is formed at the region where the agglomeration phenomenon of the alignment layer occurs, the deformation of the roof layer 360 may be prevented. For example, the support member 365 serves to support the roof layer 360.

The support member 365 is connected with the roof layer 360, and may include the same material as the roof layer 360. The second insulating layer 350 and the common electrode 270 are positioned between the support member 365 and the microcavity 305. The support member 365 is not overlapped with the pixel electrode 191, but may be overlapped with the common electrode 270.

However, the present invention is not limited thereto, and the support member 365 may include a different material from the roof layer 360, and the second insulating layer 350 and the common electrode 270 need not be positioned between the support member 365 and the microcavity 305.

Referring to FIGS. 1, 3, and 4, the support member 365 is not overlapped with the pixel electrode. The support member 365 is not formed in a region with the pixel electrode, but is formed in a region with the gate line and the gate electrode which is blocked by a horizontal light blocking member 220a. For example, a vertical width B1of the horizontal light blocking member 220a of the first valley with the support member 365 as illustrated in FIG. 3 is the same as a vertical width B2 of the horizontal light blocking member 220a of the first valley without the support member 365 as illustrated in FIG. 4.

Referring to FIGS. 1 and 3, in the exemplary embodiment of the present invention, the roof layer 360 has a protrusion 367 protruding to the region with the support member 365. The support member 365 serves to support the roof layer 360 through the protrusion 367. Since the roof layer 360 protrudes toward only the region with the support member 365, an aperture ratio is increased as compared with a case where the roof layer 360 entirely protrudes up to the region without the support member 365.

The roof layer protrusion 367 has a similar shape to that of the support member 365, and the roof layer protrusion 367 fully covers the support member. For example, the roof layer protrusion 367 is larger than the support member 365 in size. The roof layer protrusions 367 have the same number as the support members 365. As described above, since the support member 365 exists in the region which is blocked by the horizontal light blocking member 220a, the roof layer protrusion 367 may also exist in the region which is blocked by the horizontal light blocking member 220a. For example, the roof layer protrusion 367 and the support members 365 are disposed on the horizontal light blocking member 220a.

A plurality of support members 365 is formed in one edge of one microcavity 305. For example, two support members 365 are formed for each microcavity 305. However, the present invention is not limited thereto, and the number of the support members 365 may include at least one support member.

A planar shape of the support member 365 is a quadrangle shape. The present invention is not limited thereto, and the support member 365 may have various shapes such as a circle and a triangle.

A step member 362 is formed between the support member 365 and the roof layer 360. A width of the step member 362 is larger than a width of the support member 365. The step member 362 may include the same material as the support member 365. For example, the step member 362, the support member 365, and the roof layer 360 may include the same material as each other.

An overcoat 390 is formed on the roof layer 360. For example, the overcoat 390 is formed directly on the roof layer 360, and as a result, the manufacturing process is simplified. Alternatively, a third insulating layer may be formed between the roof layer 360 and the overcoat 390. The third insulating layer may include an inorganic insulating material such as silicon nitride (SiNx) and silicon oxide (SiOx).

In a manufacturing process, the second insulating layer 350, the common electrode 270, and the like which are under the second insulating layer 350 may be etched by using the roof layer 360 as a etch mask, and thus an eave does not exist at the roof layer. As illustrated in FIG. 5, the edge of the roof layer 360 exists to coincide with the edge of the lower structures under the roof layer 360.

The overcoat 390 is formed to cover the injection hole 307 exposing a part of the microcavity 305 to the outside. For example, the overcoat 390 may seal the microcavity 305 so that the liquid crystal molecules 310 formed in the microcavity 305 are not discharged outside. Since the overcoat 390 contacts the liquid crystal molecules 310, the overcoat 390 may include a material which does not react with liquid crystal molecules 310. For example, the overcoat 390 may include parylene or the like.

The overcoat 390 may include a multilayer such as a double layer and a triple layer. The double layer may include two different material layers. The triple layer may include three different material layers. For example, the overcoat 390 may include an organic insulating material layer and an inorganic insulating material layer.

Although not illustrated, polarizers may be formed on upper and lower surfaces of the display device. The polarizers may include a first polarizer and a second polarizer. The first polarizer may be attached onto the lower surface of the substrate 110, and the second polarizer may be attached onto the overcoat 390.

Next, a display device according to an exemplary embodiment of the present invention will be described below with reference to FIGS. 1 and 8.

Figure 8:
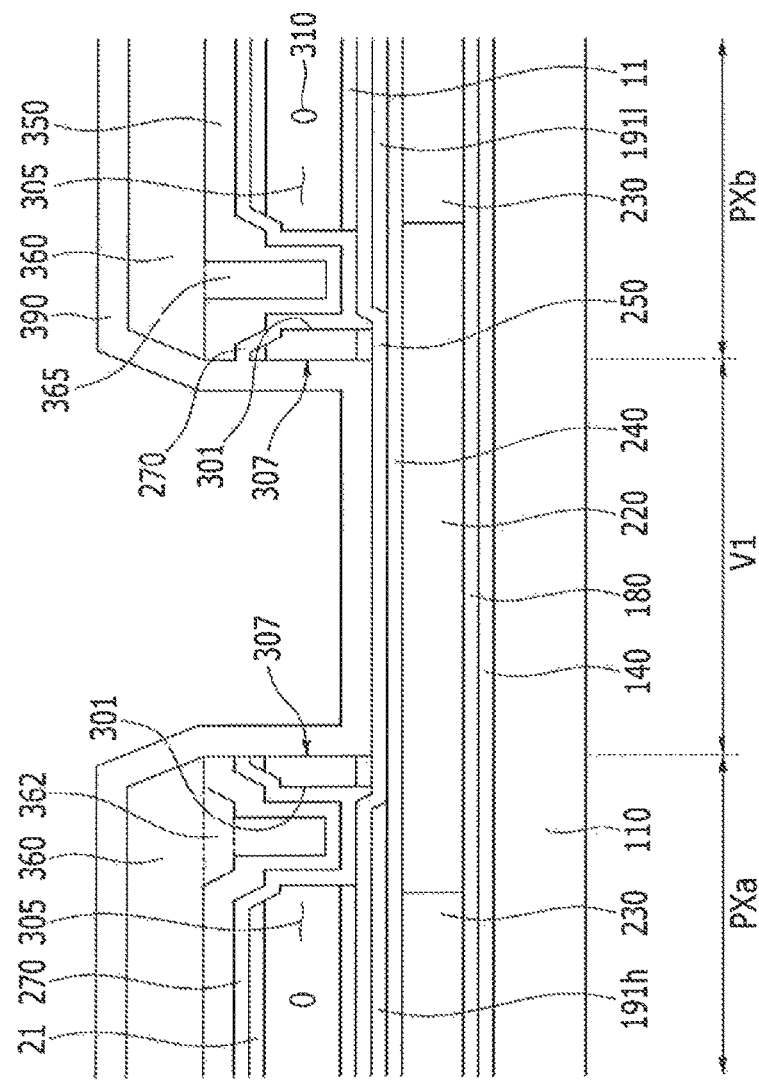
FIG. 8 is a cross-sectional view illustrating a part of the display device of FIG. 1 taken along line V-V according to an exemplary embodiment of the present invention, which illustrates the same cross section as FIG. 5.

FIG. 8 illustrates the same cross section as FIG. 5, and is a cross-sectional view taken along line V-V of the display device of FIG. 1.

The display device of FIG. 8 is substantially similar to that illustrated in FIGS. 1 to 7, except that the display device of FIG. 8 does not have the step member 362 of FIG. 5 in the second subpixel area PXb. For example, the display device of FIG. 8 includes the step member 362 in the first subpixel area PXa only.

This is because the first subpixel area PXa is relatively vulnerable to the agglomeration of the alignment layer, but the second subpixel area PXb is relatively resistant to the agglomeration of the alignment layer, and as a result, it is important to prevent the sagging of the roof layer of the first subpixel area PXa. For example, by forming the step member 362 at only the support member 365 of the first subpixel area PXa, the agglomeration of the alignment layer and the sagging of the roof layer of the first subpixel area PXa may be more effectively prevented.

Next, a display device according to an exemplary embodiment of the present invention will be described with reference to FIGS. 9 and 15.

Figure 9:
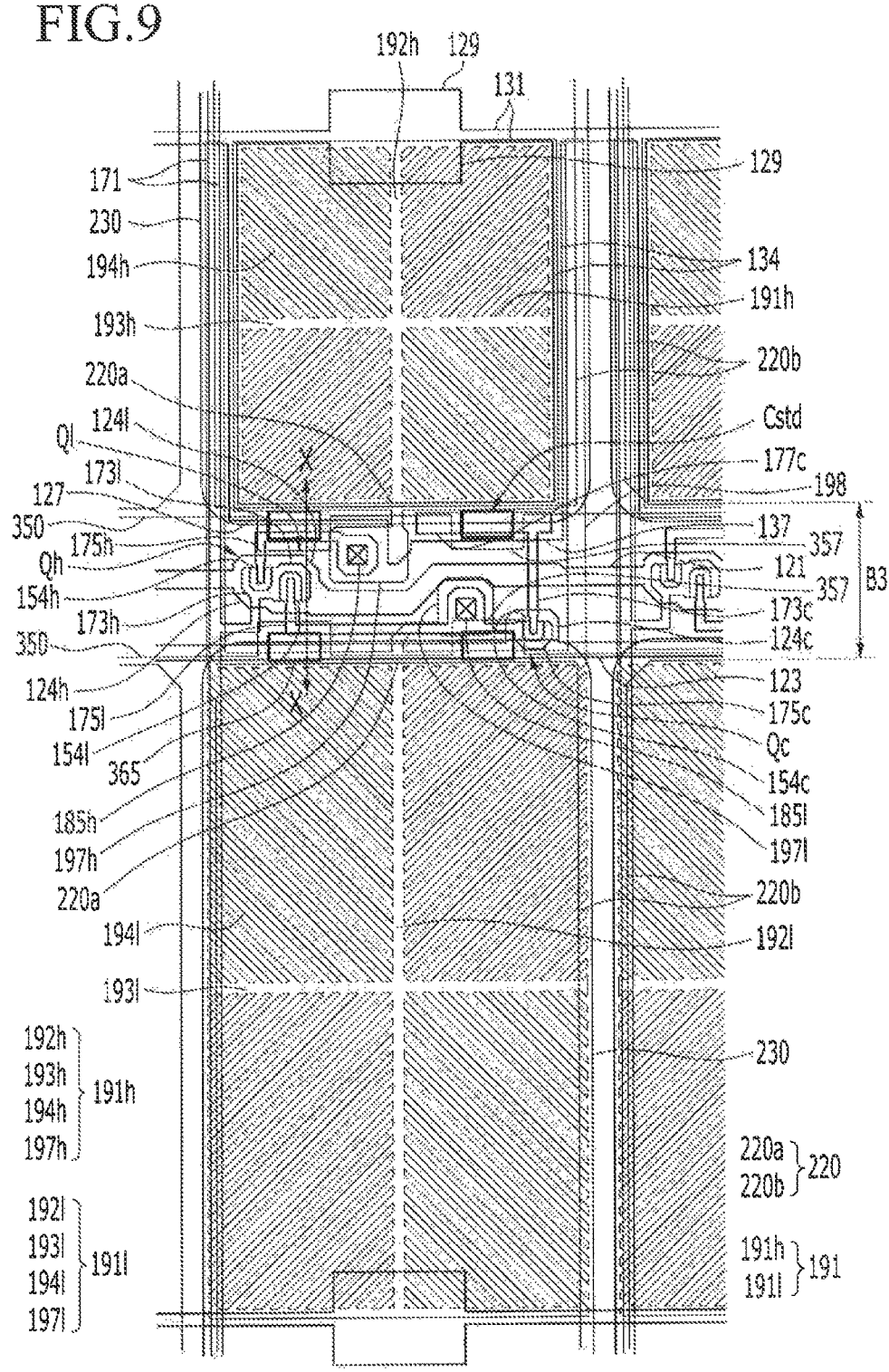
FIG. 9 is a plan view illustrating one pixel of a display device according to an exemplary embodiment of the present invention.
Figure 10:
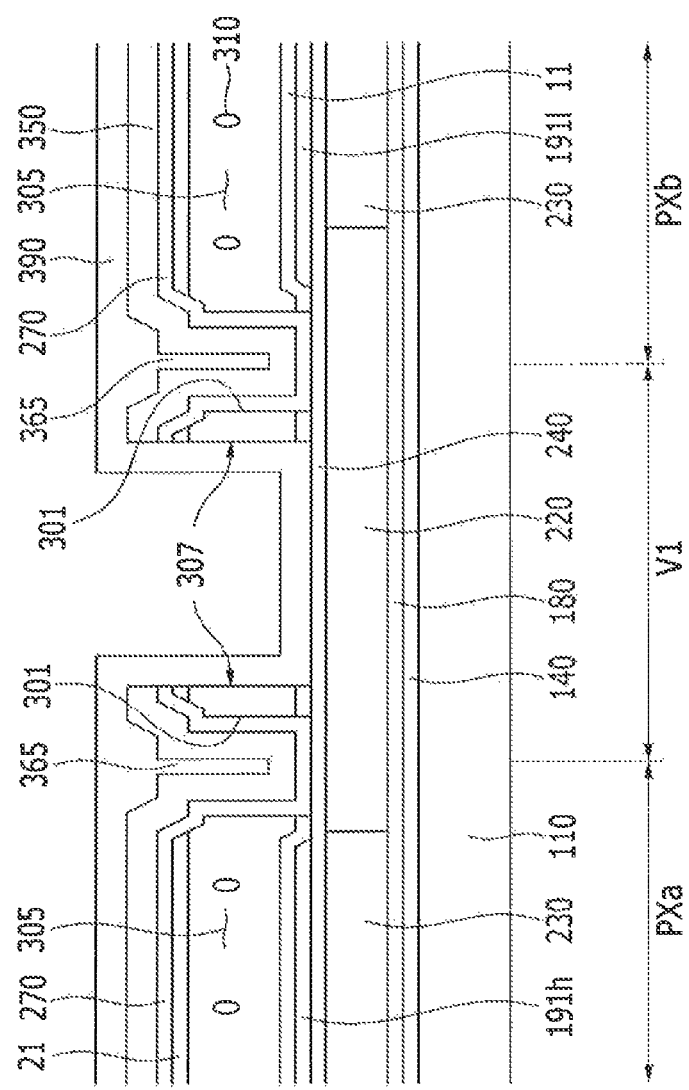
FIG. 10 is a cross-sectional view illustrating a part of the display device of FIG. 9 taken along line X-X according to an exemplary embodiment of the present invention.
Figure 11:
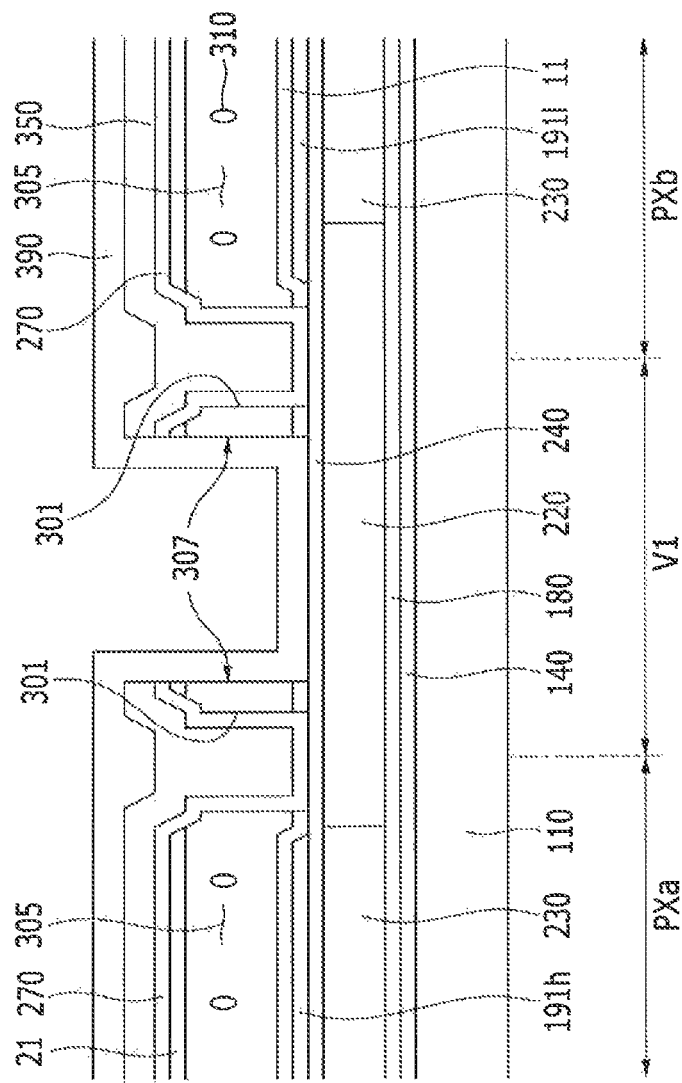
FIGS. 11 to 13 are cross-sectional views illustrating a part of the display device according to an exemplary embodiment of the present invention, which illustrate the same cross section as FIG. 10.
Figure 12:
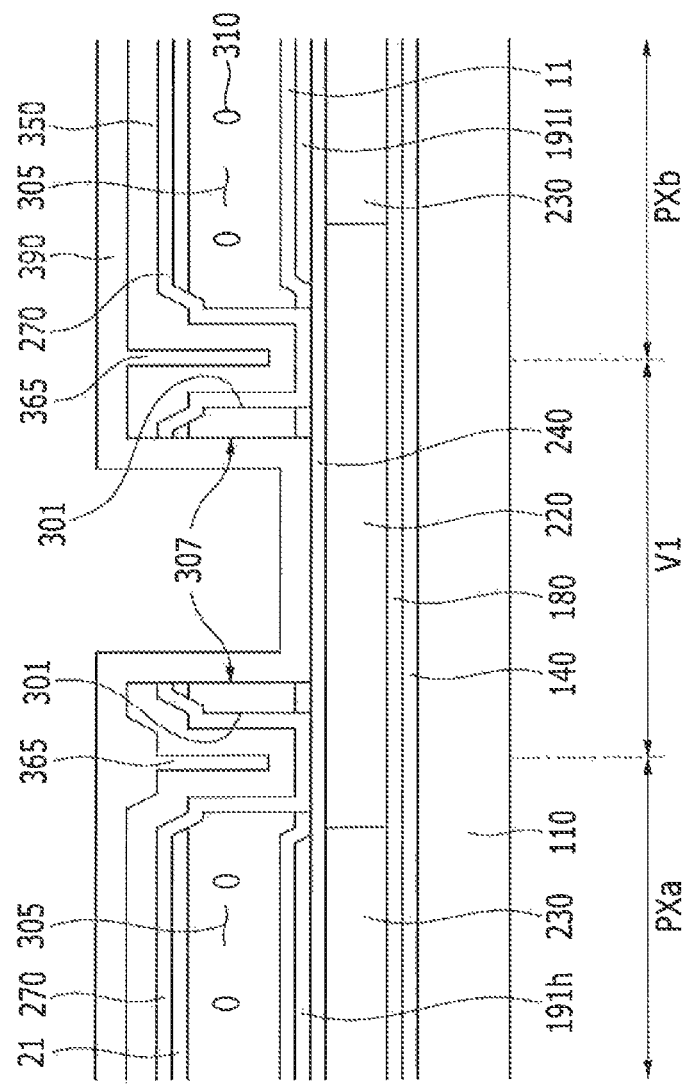
Figure 13:
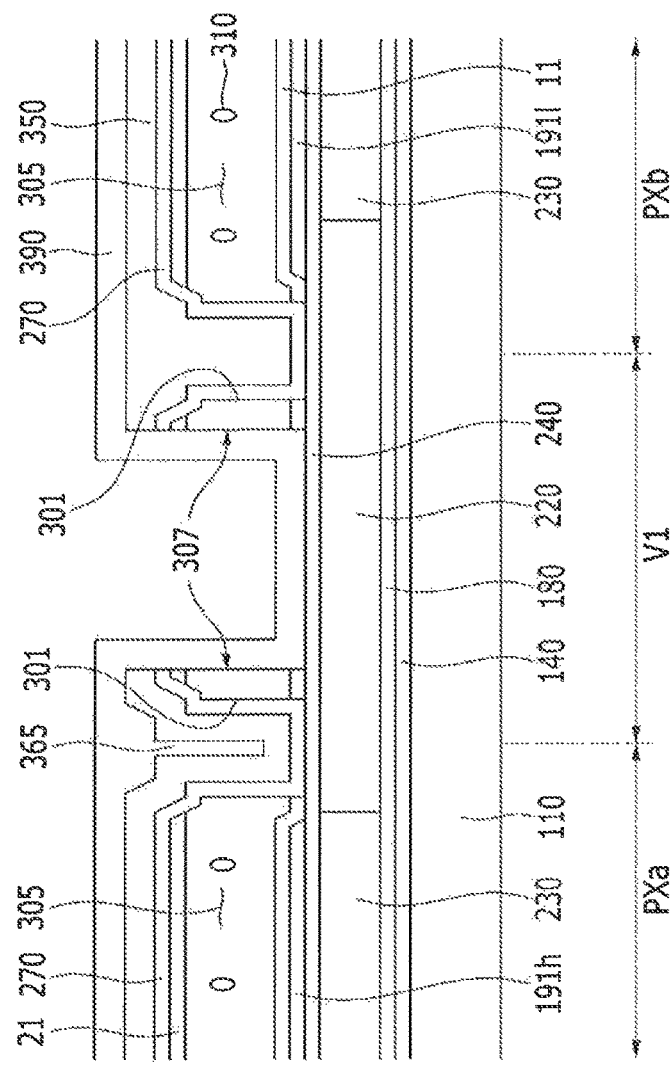

FIG. 9 is a plan view illustrating one pixel of a display device according to an exemplary embodiment of the present invention. FIG. 10 is a cross-sectional view, taken along line X-X, of the display device of FIG. 9. FIGS. 11 to 13 are cross-sectional views illustrating a part of the display device according to an exemplary embodiment of the present invention, which illustrate the same cross section as FIG. 10.

Figure 15:
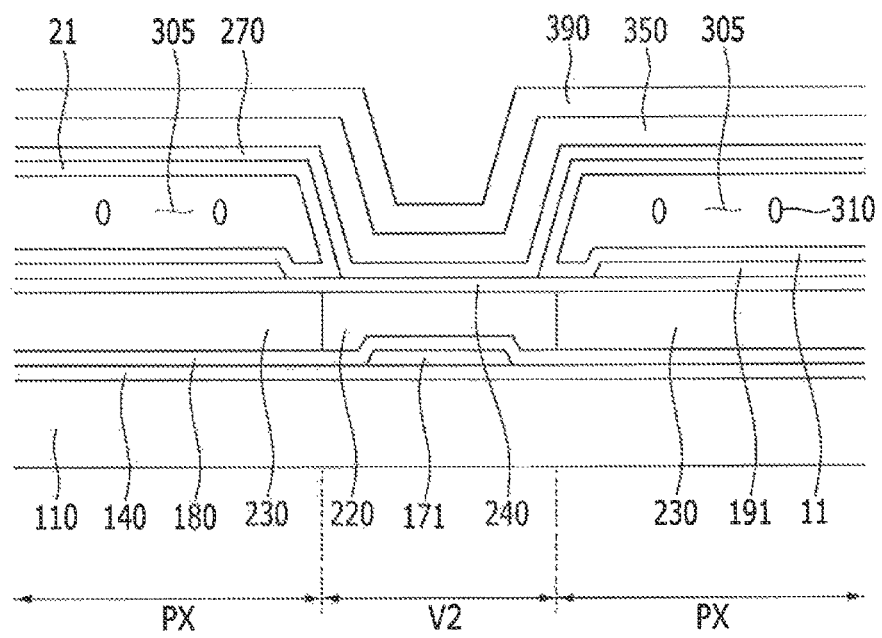
FIG. 15 illustrates a cross section at the same position as FIG. 7 in the display device according to an exemplary embodiment of the present invention.

The display device of FIGS. 9 and 15 is substantially similar to that of FIGS. 1 to 7, except that the display device of FIGS. 9 and 15 does not include the roof layer 360 of FIGS. 1 to 7. The second insulating layer 350 serves as the roof layer of FIGS. 1 to 7. In this case, the second insulating layer 350 may be referred to as a roof layer.

The second insulating layer 350 may serve as the roof layer of FIGS. 1 to 7. The second insulating layer 350 may include an inorganic material. In this case, a thickness of the second insulating layer 350 may be larger than the thickness of the second insulating layer 350 of FIGS. 1 to 7. For example, the thickness of the second insulating layer 350 may be four times or more the thickness of the second insulating layer 350 of FIGS. 1 to 7. For example, the thickness of the second insulating layer may range from about 5,000 Å to about 10,000 Å.

In this case, the manufacturing process may be simplified by omitting the roof layer 360 of FIGS. 1 to 7. The second insulating layer 350 serving as the roof layer 360 of FIGS. 1 to 7 may have a thickness enough to secure the structural stability of the display device.

Referring to FIG. 9, the second insulating layer 350 has a protrusion 357 to be supported by the support member 365 as described in FIGS. 1 to 7. The omission of the roof layer 360 may lead to the increase in the aperture ratio, and the increase in the thickness of the second insulating layer 350 may secure a structural stability without using the roof layer 360 of FIGS. 1 to 7. Since the support member 365 and the second insulating layer protrusion 357 are formed in the region which is blocked by the horizontal light blocking member 220a, the aperture ratio is not reduced.

Referring to FIG. 10, the support member 365 may be formed by the second insulating layer 350 and the overcoat 390. For example, the second insulating layer 350 defines a central empty space. The overcoat 390 fills the central empty space to form the support member 365 in the central empty space. The present invention is not limited thereto, and the support member 365 may be formed in various ways.

For example, in FIG. 11, the support member 365 may be formed by using the second insulating layer 350 only. For example, the support member 365 may be formed by the second insulating layer 350 only, by entirely filling an opening 301 using the second insulating layer 350.

In an exemplary embodiment, the support member 365 may include a material different from the second insulating layer 350 and the overcoat 390.

In FIGS. 12 and 13, a display device does not include the step member 362 of FIGS. 10 and 11 in the second subpixel area PXb. For example, the step members 362 of FIGS. 10 and 11 are formed both in the first subpixel area PXa and the second subpixel area PXb. However, in FIGS. 12 and 13, the step member 362 exists in the first subpixel area PXa only.

This is because the first subpixel area PXa is relatively vulnerable to the agglomeration of the alignment layer, but the second subpixel area PXb is relatively resistant to the agglomeration of the alignment layer, and as a result, it is more important to prevent the sagging of the second insulating layer of the first subpixel electrode PXa. For example, by forming the step member 362 at only the support member 365 of the first subpixel area PXa, the agglomeration of the alignment layer and the sagging of the second insulating layer in the first subpixel area PXa may be more effectively prevented.

Figure 14:
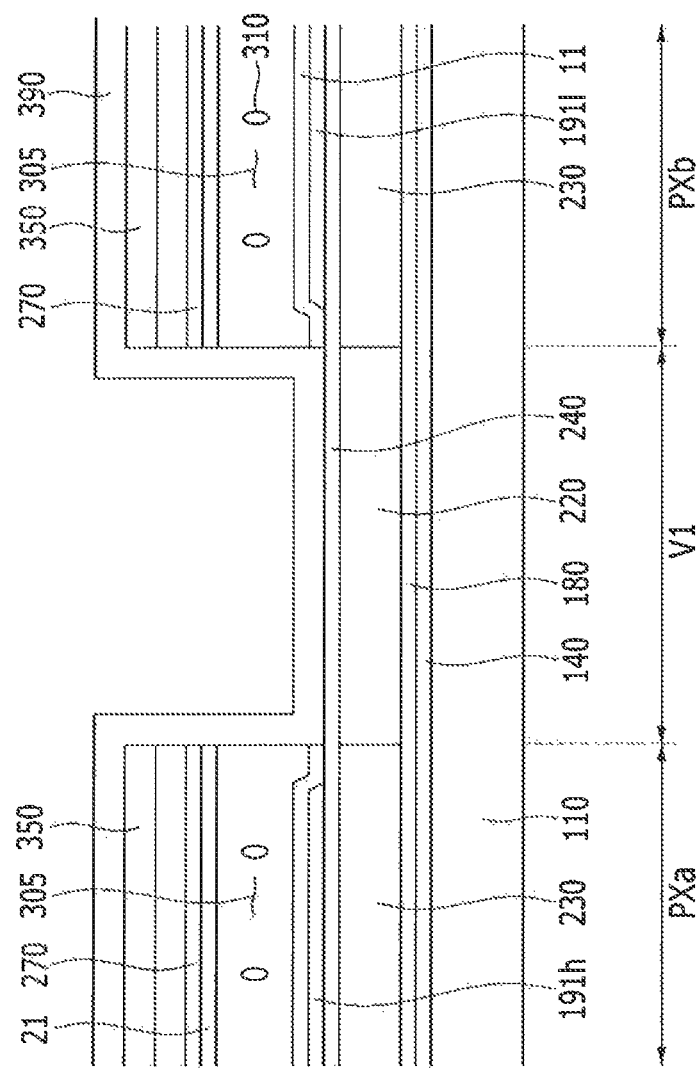
FIG. 14 illustrates the same cross section as FIG. 12 with respect to a pixel in which a support member is not formed in an exemplary embodiment of the present invention.

In FIG. 14, a display device does not include a support member. In this case, a roof layer is not formed, and a second insulating layer is thickly formed. The second insulating layer 350 is not formed in a first valley V1. The second insulating layer 350 may serve as the roof layer 360 of FIGS. 1 to 7.

In FIG. 15, unlike FIG. 7, a roof layer is not formed in a second valley. A second insulating layer 350 and an overcoat 390 are formed in the second valley.

A manufacturing process may be simplified by omitting a roof layer. Further, the support member 365 is formed in the region blocked by the horizontal light blocking member 220a, and the second insulating layer 350 is formed to have the protrusion 357 which protrudes toward the region with the support member 365. Accordingly, while the structural stability is maintained by the support member 365, the aperture ratio is not reduced. A high aperture ratio may be secured.

Figure 16:
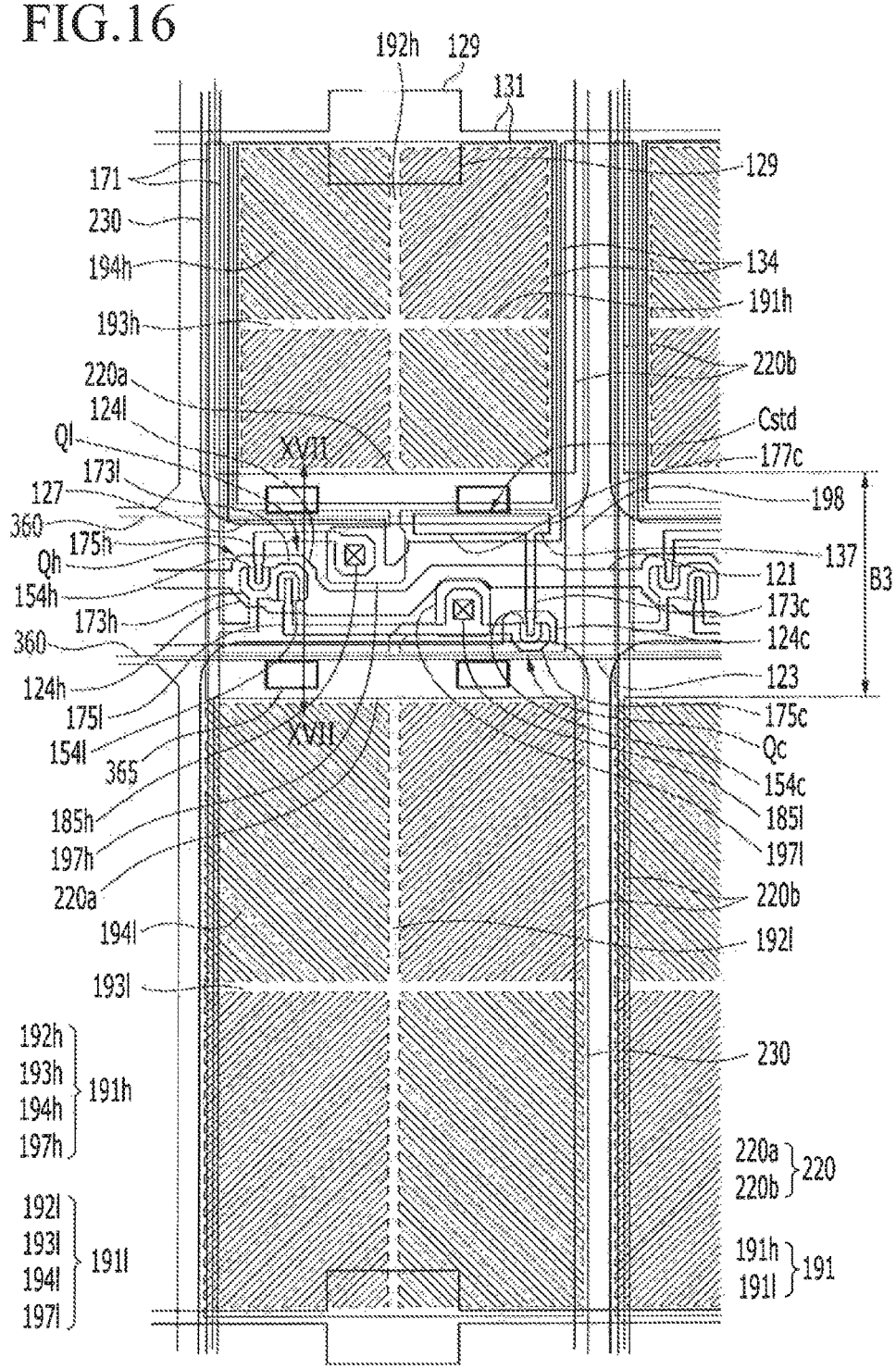
FIG. 16 is a plan view illustrating one pixel of a display device according to a Comparative Example of the present invention.
Figure 17:
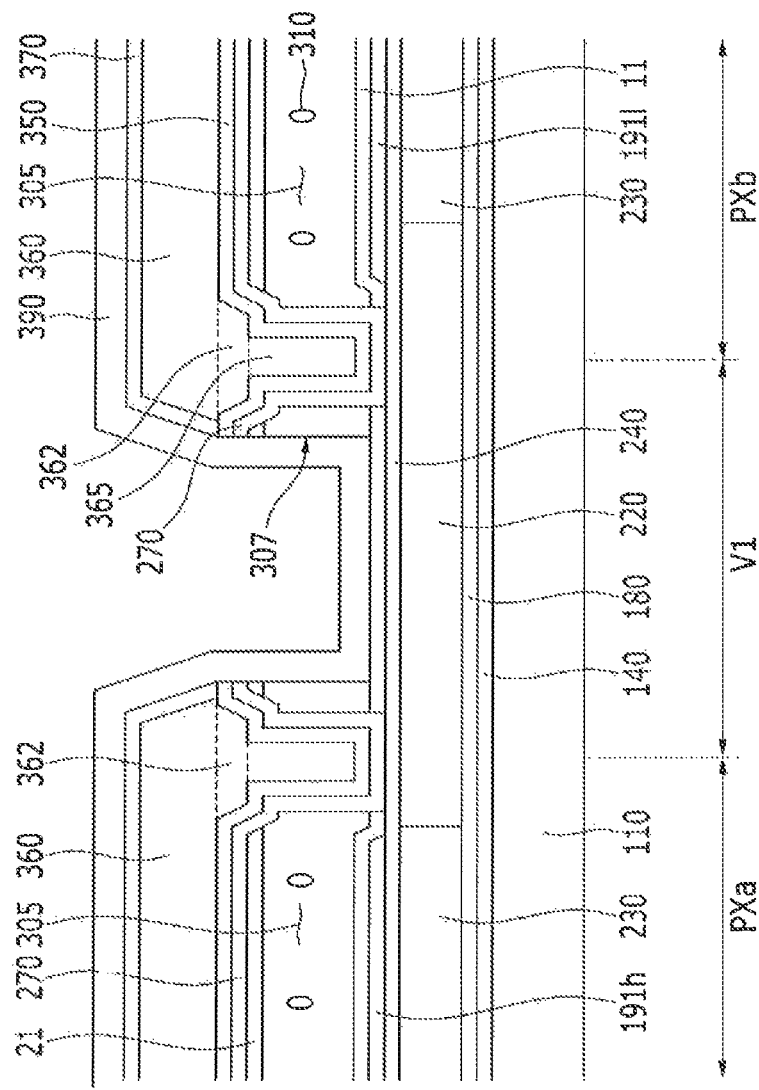
FIG. 17 is a cross-sectional view of FIG. 16 taken along line XVII-XVII.

Next, a display device according to a Comparative Example of the present invention will be described with reference to FIGS. 16 and 17 by comparing the display device according to the exemplary embodiment of the present invention. FIG. 16 is a plan view illustrating one pixel of a display device according to a Comparative Example of the present invention. FIG. 17 is a cross-sectional view, taken along line XVII-XVII, of FIG. 16.

Referring to FIGS. 16 and 17, the support member 365 is not overlapped with the gate line, the thin film transistor, and the like. Accordingly, the support members 365 are spaced apart from the gate line and a lower portion or an upper portion of the gate electrode. A width B3 of the horizontal light blocking member 220a is increased to a position where the support member 365 is formed. For example, in the Comparative Example of the present invention, an area occupied by the light blocking member is increased and thus the aperture ratio is reduced by forming the support member 365.

However, in an exemplary embodiment of the present invention, the support member 365 is overlapped with the gate line, the thin film transistor, and the like, and thus the width B1 of the horizontal light blocking member 220a is not increased, and thus the aperture ratio is not reduced. Further, the roof layer (or the second insulating layer) protrudes toward the portion where the support member 365 is formed, thereby preventing the additional reduction of the aperture ratio and securing the structural stability.

Further, referring to FIG. 17, in the case of the display device according to the Comparative Example of the present invention, both the roof layer 360 and the third insulating layer 370 on the roof layer are formed. Accordingly, many masks are used in the manufacturing process of the display device.

However, in FIGS. 5 to 8, a third insulating layer does not exist, and in FIGS. 10 to 15, both the third insulating layer and the roof layer do not exist. Accordingly, the manufacturing process may be simplified, and the number of masks used may be reduced.

Referring to FIG. 17, in the case of the Comparative Example of the present invention where the roof layer 360 and the third insulating layer 370 on the roof layer exist, an eave of the roof layer 360 is generated in the first valley. The eave of the roof layer 360 is a region where the third insulating layer 370 and the like are formed to be longer than one end of the roof layer 360. For example, in FIG. 17, the eave of the roof layer 360 means the third insulating layer 370 formed at the side of the roof layer 360. In FIG. 17, an edge of the roof layer 360 does not coincide with an edge of the lower structure, and as such, the portion where the roof layer 360 is not formed, but the lower structure exists is the eave. In FIG. 17, the eave is illustrated to be formed as much as the width of the third insulating layer 370, but actually, the eave may be longer. The eave is easily broken in the manufacturing process and causes structural instability.

However, referring to FIG. 5, the display device does not include the third insulating layer 370 formed on the roof layer 360, and thus the eave of FIG. 17 is not formed. For example, referring to FIG. 5, the edge of the lower structure of the roof layer coincides with the edge of the roof layer 360. Accordingly, the structural instability due to the eave breakage between the roof layer 360 and the second insulating layer 350 may be prevented.

Similarly, referring to FIG. 10 where the display device does not include the roof layer 360, the edge of the lower structure coincides with the edge of the second insulating layer 350. Accordingly, the eave of FIG. 17 does not exist, and the structural instability due to the eaves breakage may be prevented.

Next, a manufacturing method of a display device according to an exemplary embodiment of the present invention will be described with reference to FIGS. 1 to 8, and 18 to 21. FIGS. 18 to 21 are cross-sectional views illustrating a manufacturing method of the display device of FIGS. 1 to 8.

First, a gate line 121 and a step-down gate line 123 extending in one direction are formed on a substrate 110 including glass or plastic, and a first gate electrode 124h, a second gate electrode 124l, and a third gate electrode 124c which protrude from the gate line 121 are formed.

A storage electrode line 131 may be formed to be spaced apart from the gate line 121, the step-down gate line 123, and the first to third gate electrodes 124h, 124l, and 124c.

Next, a gate insulating layer 140 is formed on the entire surface of the substrate 110 with the gate line 121, the step-down gate line 123, the first to third gate electrodes 124h, 124l, and 124c, and the storage electrode line 131 by using an inorganic insulating material such as silicon oxide (SiOx) or silicon nitride (SiNx). The gate insulating layer 140 may include a single layer or a multilayer.

Next, a first semiconductor 154h, a second semiconductor 154l, and a third semiconductor 154c are formed by depositing and then patterning a semiconductor material such as amorphous silicon, polycrystalline silicon, and metal oxide on the gate insulating layer 140. The first semiconductor 154h may be positioned on the first gate electrode 124h, the second semiconductor 154l may be positioned on the second gate electrode 124I, and the third semiconductor 154c may be positioned on the third gate electrode 124c.

Next, a data line 171 extending in the other direction is formed by depositing and then patterning a metal material. The metal material may be formed in a single layer or a multilayer.

Further, a first source electrode 173h protruding above the first gate electrode 124h from the data line 171, and a first drain electrode 175h spaced apart from the first source electrode 173h are formed together. Further, a second source electrode 173l connected with the first source electrode 173h, and a second drain electrode 175l spaced apart from the second source electrode 173l are formed together. Further, a third source electrode 173c extended from the second drain electrode 175l, and a third drain electrode 175c spaced apart from the third source electrode 173c are formed together.

The first to third semiconductors 154h, 154l, and 154c, the data line 171, the first to third source electrodes 173h, 173l, and 173c, and the first to third drain electrodes 175h, 175l, and 175c may be formed by sequentially depositing and then simultaneously patterning a semiconductor material and a metal material. In this case, the first semiconductor 154h may be extended to the lower portion of the data line 171.

The first/second/third gate electrodes 124h/124l/124c, the first/second/third source electrodes 173h/173l/173c, and the first/second/third drain electrodes 175h/175l/175c form first/second/third thin film transistors (TFTs) Qh/Ql/Qc together with the first/second/third semiconductors 154h/154l/154c, respectively.

Next, a passivation layer 180 is formed on the data line 171, the first to third source electrodes 173h, 173l, and 173c, the first to third drain electrodes 175h, 175l, and 175c, and the semiconductors 154h, 154I, and 154c exposed between the respective source electrodes 173h/173l/173c and the respective drain electrodes 175h/175l/175c. The passivation layer 180 may include an organic insulating material or an inorganic insulating material, and may be formed as a single layer or a multilayer.

Next, a color filter 230 is formed in each pixel area PX on the passivation layer 180. The color filter 230 is formed in each of the first subpixel area PXa and the second subpixel area PXb, and need not be formed in the first valley V1. Further, the color filters 230 having the same color may be formed in a column direction of the plurality of pixel areas PX. In the case of forming the color filters 230 having three colors, a first colored color filter 230 may be first formed using a mask, and then a second colored color filter 230 may be formed by shifting the mask. Next, the second colored color filter 230 may be formed and then a third colored color filter may be formed by shifting the mask.

Next, a light blocking member 220 is formed on a boundary of each pixel area PX on the passivation layer 180 and the thin film transistor. The light blocking member 220 may be formed in the first valley V1 positioned between the first subpixel area PXa and the second subpixel area PXb.

Further, the light blocking member 220 is formed even at one edge of each pixel area PX. The light blocking member 220 is formed to overlap a support member 365 to be formed below.

The light blocking member 220 is formed after forming the color filters 230, but the present invention is not limited thereto. For example, the light blocking member 220 may be first formed and then the color filters 230 may be formed.

Next, a first insulating layer 240 including an inorganic insulating material such as silicon nitride (SiNx) and silicon oxide (SiOx) is formed on the color filter 230 and the light blocking member 220.

Next, a first contact hole 185h is formed by etching the passivation layer 180, the light blocking member 220, and the first insulating layer 240 to expose a part of the first drain electrode 175h, and a second contact hole 185l is formed to expose a part of the second drain electrode 175l.

Next, a first subpixel electrode 191h is formed in the first subpixel area PXa, and a second subpixel electrode 191l is formed in the second subpixel area PXb, by depositing and then patterning a transparent metal material such as indium tin oxide (ITO) and indium zinc oxide (IZO) on the first insulating layer 240. The first subpixel electrode 191h and the second subpixel electrode 191l are separated from each other with the first valley V1 therebetween. The first subpixel electrode 191h is connected with the first drain electrode 175h through the first contact hole 185h, and the second subpixel electrode 191l is connected with the second drain electrode 175l through the second contact hole 185l.

Horizontal stems 193h and 193l, and vertical stems 192h and 192l crossing the horizontal stems 193h and 193l are formed at the first subpixel electrode 191h and the second subpixel electrode 191l, respectively. Further, a plurality of minute branches 194h and 194l, which obliquely extends from the horizontal stems 193h and 193l and the vertical stems 192h and 192l, is formed.

Figure 18:
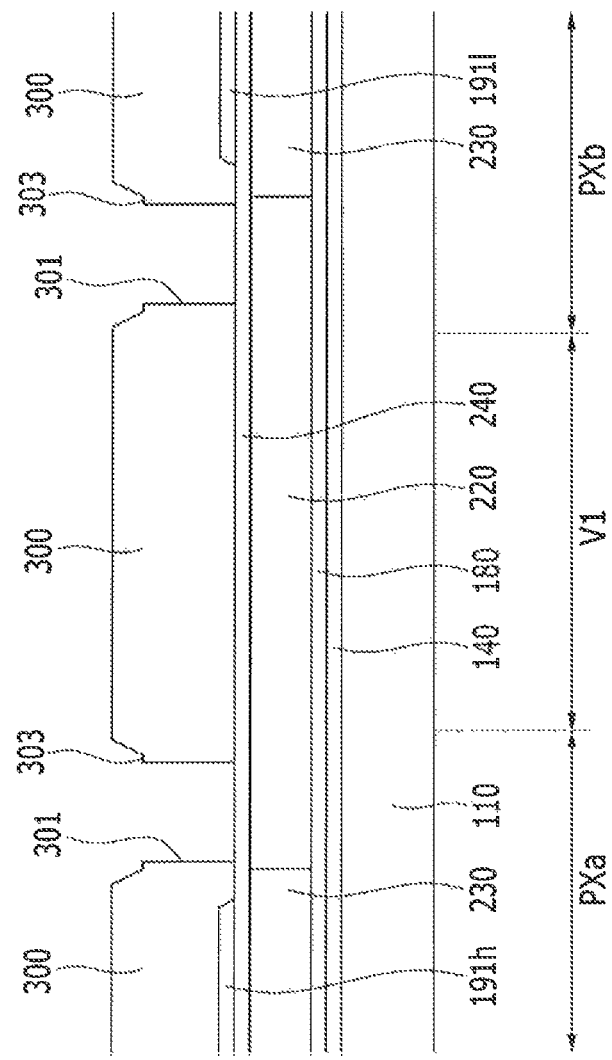
FIGS. 18 to 21 are process cross-sectional views illustrating a manufacturing method of the display device according to an exemplary embodiments illustrated in FIGS. 1 to 8.

As illustrated in FIG. 18, a sacrificial layer 300 is formed by coating a photosensitive organic material on the pixel electrode 191 and performing a photolithography process.

The sacrificial layers 300 are patterned to be connected to each other along the plurality of pixel columns. For, the sacrificial layer 300 is formed to cover each pixel area PX, and formed to cover the first valley V1 positioned between the first subpixel area PXa and the second subpixel area PXb.

For example, the photosensitive organic material positioned at the second valley V2 is removed through the photolithography process. Further, an opening 301 is formed by removing a partial region of the sacrificial layer 300 through the photolithography process. The opening 301 is adjacent to the first valley V1. The first insulating layer 240 positioned below the photosensitive organic material is exposed by forming the opening 301.

Further, when the opening 301 is formed, a groove portion is further formed at the sacrificial layer 300 by slit-exposing or halftone-exposing a periphery of the opening 301. The sacrificial layer 300 may be patterned by using a slit mask or a halftone mask. Since the groove portion is formed by developing a part of the sacrificial layer 300, a portion of the sacrificial layer 300 where the groove portion is formed is smaller than another portion in thickness. The groove portion may be formed to surround the opening 301.

The groove portion is formed in the first and the second subpixel areas PXa and PXb. The present invention is not limited thereto. For example, the groove portion may be formed only in one of the first and the second subpixel area PXa and PXb. For example, the groove portion may be formed only in the first subpixel electrode, and need not be formed in the second subpixel electrode.

Figure 19:
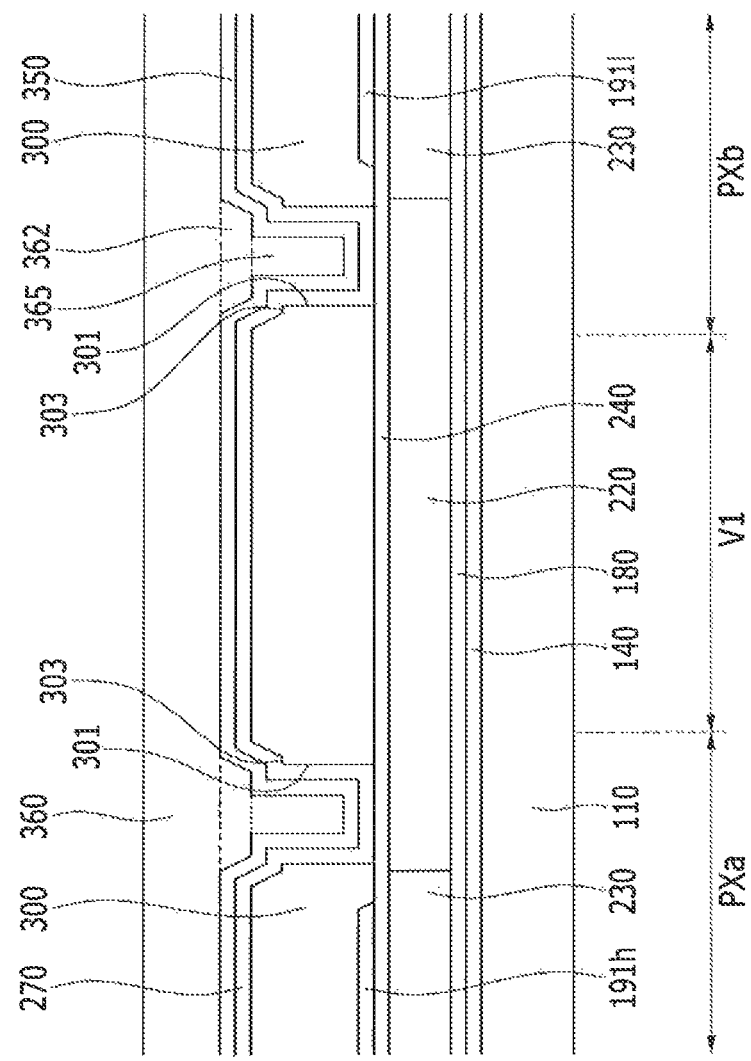

As illustrated in FIG. 19, a common electrode 270 is formed by depositing a transparent metal material such as indium tin oxide (ITO) and indium zinc oxide (IZO) on the sacrificial layer 300.

Next, a second insulating layer 350 is formed on the common electrode 270 with an inorganic insulating material such as silicon oxide and silicon nitride.

In this case, the thickness of the second insulating layer 350 may range from about 5,000 Å to about 10,000 Å.

Next, a roof layer 360 is formed on the second insulating layer 350 with an organic material, and the support member 365 is formed in the opening 301. The roof layer 360 and the support member 365 may be formed by using the same material in the same process.

The shapes of the roof layer 360 and the support member 365 are described above. For example, the support member 365 is overlapped with the gate line, the gate electrode, and the like to exist in the horizontal light blocking member, and the roof layer 360 has a protrusion protruding to a region where the support member 365 is formed.

A step member 362 is formed in the groove portion of the sacrificial layer 300 in a process of forming the roof layer 360 and the opening 301. The roof layer 360, the support member 365, and the step member 362 may be simultaneously formed by coating an organic material on the entire surface of the substrate 110 after forming the second insulating layer 350. For example, the roof layer 360, the support member 365, and the step member 362 may be formed by using the same material in the same process.

The step member 362 is formed in the first and the second subpixel area PXa and PXb. Alternatively, the step member 362 may be formed only in one of the first and the second subpixel area. For example, the step member may be formed only in the first subpixel area, and need not be formed in the second subpixel electrode.

The common electrode 270 and the second insulating layer 350 are positioned below the roof layer 360. The common electrode 270 and the second insulating layer 350 are positioned between the sacrificial layer 300 and the support member 365.

The support member 365 has a column shape, and the planar shape of the support member 365, when viewed from the above, may be various shapes such as a circle, a quadrangle, and a triangle.

Figure 20:
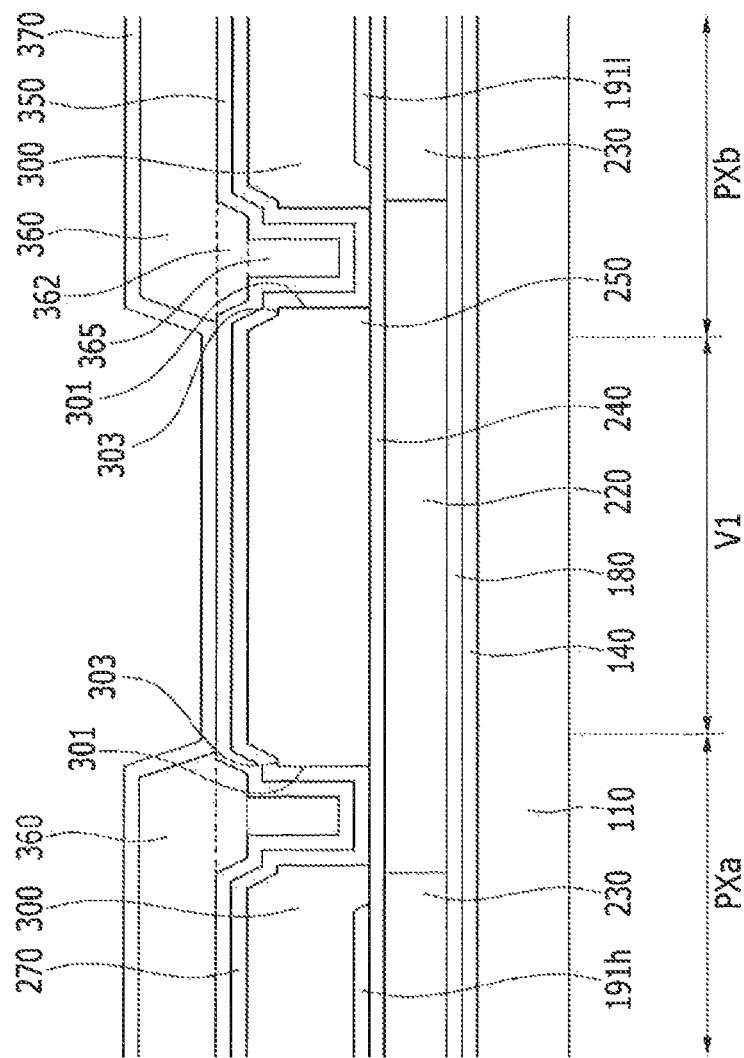

As illustrated in FIG. 20, the roof layer 360 positioned in the first valley V1 is removed by patterning the roof layer 360. As a result, the roof layers 360 are extended along a plurality of pixel rows, and two adjacent roof layers 360 are spaced apart from each other by the first valley V1.

Figure 21:
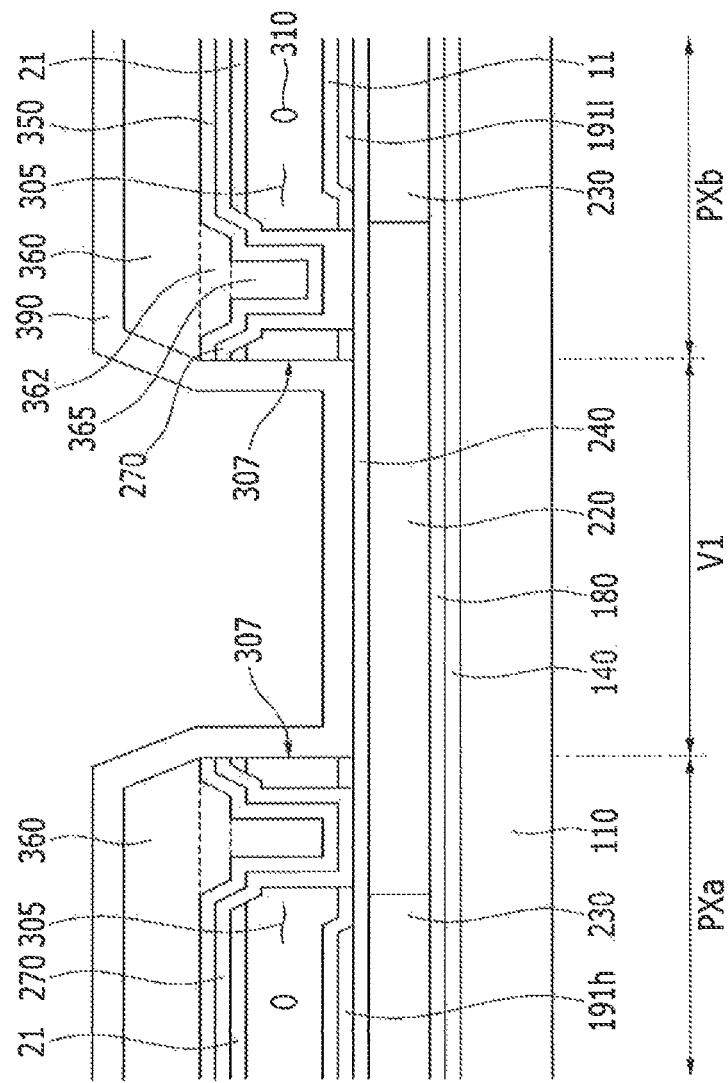
Figure 22:
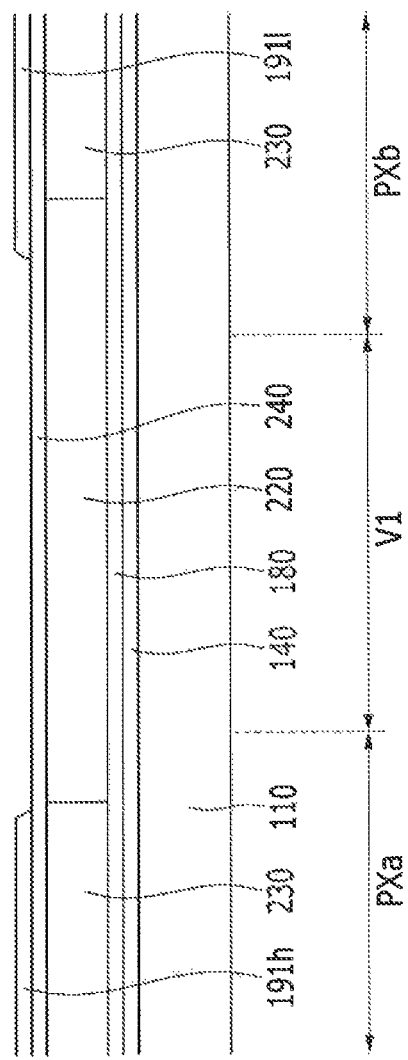

As illustrated in FIG. 21, the second insulating layer 350 and the common electrode 270 are patterned by using the roof layer as a mask to remove the second insulating layer 350 and the common electrode 270 positioned in the first valley V1.

In this case, the patterned roof layer 360 may serve as a mask for patterning lower structure positioned below the patterned roof layer 360, and thus the number of masks used in the manufacturing process may be reduced.

The sacrificial layer 300 positioned in the first valley V1 is exposed outside by patterning the roof layer 360 and the common electrode 270.

Next, the sacrificial layer 300 is entirely removed by supplying a developer on the substrate 110 where the sacrificial layer 300 is exposed. The present invention is not limited thereto. For example, the sacrificial layer 300 may be removed using various methods.

The removal of sacrificial layer 300 may leave behind the microcavity 305 in a region where the sacrificial layer 300 is positioned.

The pixel electrode 191 and the common electrode 270 are spaced apart from each other with the microcavity 305 therebetween, and the pixel electrode 191 and the roof layer 360 are spaced apart from each other with the microcavity 305 therebetween. The common electrode 270 and the roof layer 360 are formed to cover the upper surface and a pair of two facing sides of the microcavity 305.

The microcavity 305 is exposed outside through a portion where the roof layer 360 and the common electrode 270 are removed, which is called an injection hole 307. The injection hole 307 is formed along the first valley V1. For example, the injection holes 307 may be formed to face each other at the edges of the first subpixel area PXa and the second subpixel area PXb. For example, the injection holes 307 may be formed in the lower edge of the first subpixel area PXa and the upper edge of the second subpixel area PXb to expose the side of the microcavity 305. Alternatively, the injection hole 307 may be formed along the second valley V2.

Hereinafter, a positional relationship of the injection hole 307 and the support member 365 will be described below.

The support member 365 is adjacent to the injection hole 307 to be formed in the microcavity 305. Two injection holes 307 may be formed in one microcavity 305, and the support member 365 is adjacent to one injection hole 307 of the two injection holes 307.

The support member 365 is formed to be adjacent to both sides of the first valley V1. For example, the support member 365 is formed to be adjacent to one first valley V1 of the odd-numbered first valley V1 and the even-numbered first valley V1, but is not formed to be adjacent to the other first valley V1 thereof.

A plurality of support members 365 is formed in one edge of one microcavity 305. The number of support members 365 formed for two facing microcavities across the first valley may be different from each other. For example, one support member 365 is formed in the first subpixel area and two support members 365 may be formed in the second subpixel area, and the reverse case thereof is possible.

Next, the roof layer 360 is cured by applying heat to the substrate 110. The shape of the microcavity 305 may be secured by the roof layer 360.

Next, when an aligning agent containing an alignment material is dropped on the substrate 110 by a spin coating method or an inkjet method, the aligning agent is injected into the microcavity 305 through the injection hole 307. When the aligning agent is injected into the microcavity 305 and then a curing process is performed, a solution component is evaporated and the alignment material remains on the inner wall of the microcavity 305.

Accordingly, the first alignment layer 11 is formed on the pixel electrode 191, and the second alignment layer 21 is formed below the common electrode 270. The first alignment layer 11 and the second alignment layer 21 are formed to face each other with the microcavity 305 therebetween, and to be connected to each other at an edge of the pixel area PX.

The first and second alignment layers 11 and 21 may be aligned in a vertical direction to the substrate 110, except for the side of the microcavity 305. In addition, a process of irradiating UV rays to the first and second alignment layers 11 and 21 is performed, and as a result, the first and second alignment layers 11 and 21 may be aligned in a horizontal direction to the substrate 110.

Next, liquid crystal molecules 310 are dropped on the substrate 110 by an inkjet method or a dispensing method into the microcavity 305 through the injection hole 307. In this case, a liquid crystal material is dropped only in any one injection hole 307 of the injection hole 307 formed along the odd-numbered first valley V1 and the injection hole 307 formed along the even-numbered first valley V1. For example, when the support member 365 is formed to be adjacent to both sides of the odd-numbered first valley V1, the liquid crystal material is dropped in the even-numbered first valley V1, but is not dropped in the odd-numbered first valley V1. On the contrary, when the support member 365 is formed to be adjacent to both sides of the even-numbered first valley V1, the liquid crystal material is dropped in the odd-numbered first valley V1, but is not dropped in the even-numbered first valley V1.

When the liquid crystal material is dropped in the injection holes 307 formed along the odd-numbered first valleys V1, the liquid crystal material passes through the injection hole 307 by a capillary force to be injected into the microcavity 305. In this case, discharging of air from the microcavity 305 may occur through the injection hole 307 formed along the even-numbered first valley V1.

Next, an overcoat 390 is formed by depositing a material which does not react with the liquid crystal molecules 310 on the roof layer 360. The overcoat 390 is formed to cover the injection hole 307 where the microcavity 305 is exposed outside to seal the microcavity 305.

Next, although not illustrated, polarizers may be further attached onto the upper and lower surfaces of the display device. The polarizers may be configured by a first polarizer and a second polarizer. The first polarizer may be attached onto the lower surface of the substrate 110, and the second polarizer may be attached onto the overcoat 390.

Next, a manufacturing method of a display device according to an exemplary embodiment of the present invention will be described with reference to FIGS. 9 to 15, and FIGS. 22 to 27. FIGS. 22 to 27 are process cross-sectional views for manufacturing the display device according to FIGS. 9 to 15.

First, a gate line 121 and a step-down gate line 123 extending in one direction are formed on a substrate 110 made of glass or plastic, and a first gate electrode 124h, a second gate electrode 124l, and a third gate electrode 124c which protrude from the gate line 121 are formed.

Further, a storage electrode line 131 may be formed to be spaced apart from the gate line 121, the step-down gate line 123, and the first to third gate electrodes 124h, 124l, and 124c.

Next, a gate insulating layer 140 is formed on the entire surface of the substrate 110 with the gate line 121, the step-down gate line 123, the first to third gate electrodes 124h, 124l, and 124c, and the storage electrode line 131 by using an inorganic insulating material such as silicon oxide (SiOx) or silicon nitride (SiNx). The gate insulating layer 140 may be formed by a single layer or a multilayer.

Next, a first semiconductor 154h, a second semiconductor 154l, and a third semiconductor 154c are formed by depositing and then patterning a semiconductor material such as amorphous silicon, polycrystalline silicon, and metal oxide on the gate insulating layer 140. The first semiconductor 154h may be positioned on the first gate electrode 124h, the second semiconductor 154l may be positioned on the second gate electrode 124I, and the third semiconductor 154c may be positioned on the third gate electrode 124c.

Next, a data line 171 extending in the other direction is formed by depositing and then patterning a metal material. The metal material may be formed by a single layer or a multilayer.

Further, a first source electrode 173h protruding above the first gate electrode 124h from the data line 171, and a first drain electrode 175h spaced apart from the first source electrode 173h are formed together. Further, a second source electrode 173l connected with the first source electrode 173h, and a second drain electrode 175l spaced apart from the second source electrode 173l are formed together. Further, a third source electrode 173c extended from the second drain electrode 175l, and a third drain electrode 175c spaced apart from the third source electrode 173c are formed together.

The first to third semiconductors 154h, 154l, and 154c, the data line 171, the first to third source electrodes 173h, 173l, and 173c, and the first to third drain electrodes 175h, 175l, and 175c may be formed by sequentially depositing and then simultaneously patterning a semiconductor material and a metal material. In this case, the first semiconductor 154h may be extended to the lower portion of the data line 171.

The first/second/third gate electrodes 124h/124l/124c, the first/second/third source electrodes 173h/173l/173c, and the first/second/third drain electrodes 175h/175l/175c form first/second/third thin film transistors (TFTs) Qh/Ql/Qc together with the first/second/third semiconductors 154h/154l/154c, respectively.

Next, a passivation layer 180 is formed on the data line 171, the first to third source electrodes 173h, 173l, and 173c, the first to third drain electrodes 175h, 175l, and 175c, and the semiconductors 154h, 154l, and 154c exposed between the respective source electrodes 173h/173l/173c and the respective drain electrodes 175h/175l/175c. The passivation layer 180 may include an organic insulating material or an inorganic insulating material, and may be formed as a single layer or a multilayer.

Next, a color filter 230 is formed in each pixel area PX on the passivation layer 180. The color filter 230 is formed in each of the first subpixel area PXa and the second subpixel area PXb, and need not be formed at the first valley V. Further, the color filters 230 having the same color may be formed in a column direction of the plurality of pixel areas PX. In the case of forming the color filters 230 having three colors, a first colored color filter 230 may be first formed and then a second colored color filter 230 may be formed by shifting a mask. Next, the second colored color filter 230 may be formed and then a third colored color filter may be formed by shifting a mask.

Next, a light blocking member 220 is formed on a boundary of each pixel area PX on the passivation layer 180 and the thin film transistor. The light blocking member 220 may be formed even in the first valley V1 positioned between the first subpixel area PXa and the second subpixel area PXb.

Further, the light blocking member 220 is formed even at one edge of each pixel area PX. The light blocking member 220 is formed to correspond to a portion which is overlapped with a support member 365 to be formed below.

Hereinabove, it is described that the light blocking member 220 is formed after forming the color filters 230, but the present invention is not limited thereto, and the light blocking member 220 may be first formed and then the color filters 230 may be formed.

Next, a first insulating layer 240 including an inorganic insulating material such as silicon nitride (SiNx) and silicon oxide (SiOx) is formed on the color filter 230 and the light blocking member 220.

Next, a first contact hole 185h is formed by etching the passivation layer 180, the light blocking member 220, and the first insulating layer 240 to expose a part of the first drain electrode 175h, and a second contact hole 185l is formed to expose a part of the second drain electrode 175l.

Next, a first subpixel electrode 191h is formed in the first subpixel area PXa, and a second subpixel electrode 191l is formed in second subpixel area PXb, by depositing and then patterning a transparent metal material such as indium tin oxide (ITO) and indium zinc oxide (IZO) on the first insulating layer 240. The first subpixel electrode 191h and the second subpixel electrode 191l may be separated from each other with the first valley V1 therebetween. The first subpixel electrode 191h is connected with the first drain electrode 175h through the first contact hole 185h, and the second subpixel electrode 191l is connected to the second drain electrode 175l through the second contact hole 185l.

Horizontal stems 193h and 193l, and vertical stems 192h and 192l crossing the horizontal stems 193h and 193l are formed at the first subpixel electrode 191h and the second subpixel electrode 191l, respectively. Further, a plurality of minute branches 194h and 194l, which obliquely extends from the horizontal stems 193h and 193l and the vertical stems 192h and 192l, is formed.

Figure 23:
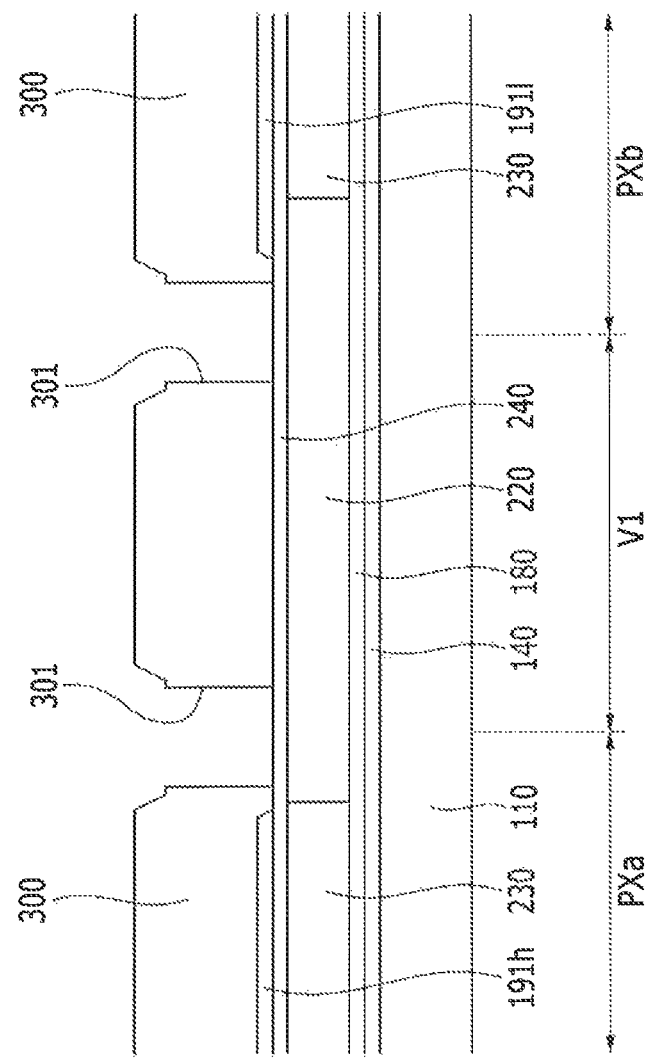

As illustrated in FIG. 23, a sacrificial layer 300 is formed by coating a photosensitive organic material on the pixel electrode 191 and performing a photolithography process.

The sacrificial layers 300 are formed to be connected to each other along the plurality of pixel columns. For example, the sacrificial layer 300 is formed to cover each pixel area PX, and formed to cover the first valley V1 positioned between the first subpixel area PXa and the second subpixel area PXb.

The photosensitive organic material positioned at the second valley V2 is removed through the photolithography process. Further, an opening 301 is formed by removing a partial region of the sacrificial layer 300 through the photolithography process. The opening 301 is adjacent to the first valley V1. The first insulating layer 240 positioned below the photosensitive organic material is exposed by forming the opening 301.

Further, when the opening 301 is formed, a groove portion is further formed on the sacrificial layer 300 by slit-exposing or halftone-exposing a periphery of the opening 301. The groove portion of the sacrificial layer 300 may be patterned by using a slit mask or a halftone mask. Since the groove portion is formed by developing a part of the sacrificial layer 300, a portion of the sacrificial layer 300 where the groove portion 303 is formed is formed to be smaller than another portion in thickness. The groove portion may be formed to surround the opening 301.

The groove portion may be formed only at one of the first subpixel electrode and the second subpixel electrode. In detail, the groove portion is formed only at the first subpixel electrode, but may not be formed at the second subpixel electrode.

Figure 24:
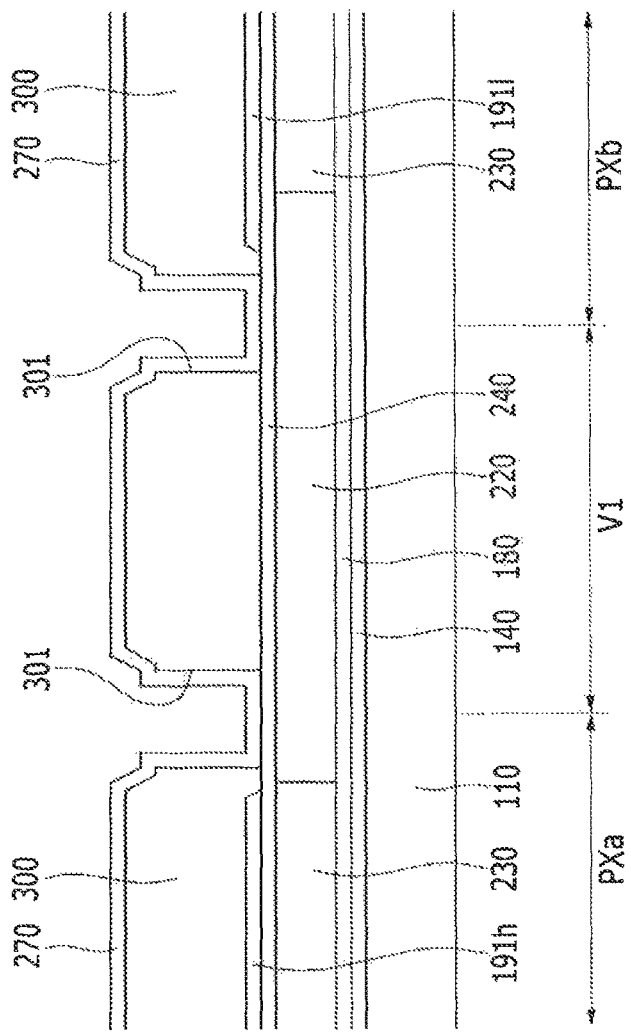

As illustrated in FIG. 24, a common electrode 270 is formed by depositing a transparent metal material such as indium tin oxide (ITO) and indium zinc oxide (IZO) on the sacrificial layer 300.

Figure 25:
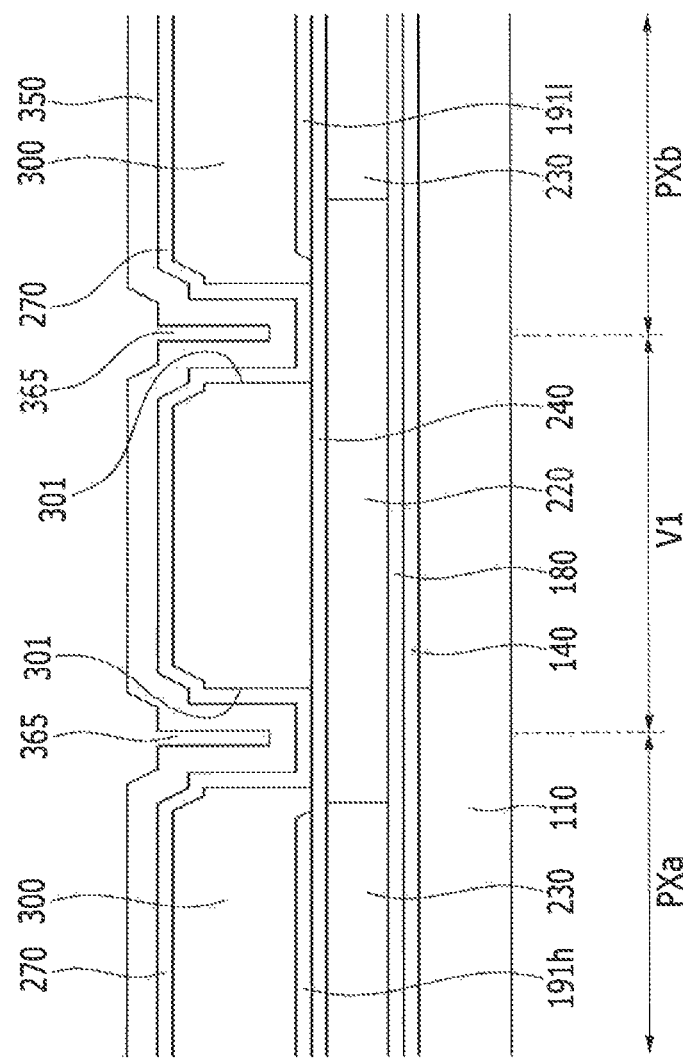

Next, as illustrated in FIG. 25, a second insulating layer 350 made of an inorganic insulating material such as silicon oxide and silicon nitride is formed on the common electrode 270. In this case, the thickness of the second insulating layer 350 may range between about 5,000 Å and about 10,000 Å.

In an exemplary embodiment, the second insulating layer 350 performs a function similar to the roof layer, and the roof layer need not be formed. Accordingly, since the formation process of the roof layer may be omitted, the manufacturing process may be simplified.

In this case, the support member is formed in the opening 301 when the second insulating layer is formed. The second insulating layer 350 and the support member 365 may be formed by using the same material in the same process. The support member 365 may be filled with a second insulating layer 350 material only, or the center of the support member 365 may be filled by a material of the overcoat 390 thereafter.

In this case, the shapes of the second insulating layer 350 and the support member 365 are as described above. For example, the support member 365 is overlapped with the gate line, the gate electrode, and the like to exist in the horizontal light blocking member, and the second insulating layer 350 has a protrusion 357 protruding to a region where the support member 365 is formed.

A step member 362 may be further formed in the groove portion of the sacrificial layer 300 in a process of forming the second insulating layer 350 and the opening 301. The second insulating layer 350, the support member 365, and the step member 362 may be simultaneously formed. That is, the second insulating layer 350, the support member 365, and the step member 362 may be formed by using the same material during the same process.

The step member 362 may be formed only at one of the first subpixel electrode and the second subpixel electrode. For example, the step member is formed only at the first subpixel electrode, but may not be formed at the second subpixel electrode.

The support member 365 has a column shape, and the planar shape of the support member 365 viewed from the upper side of the substrate 110 may be various shapes such as a circle, a quadrangle, and a triangle.

Figure 26:
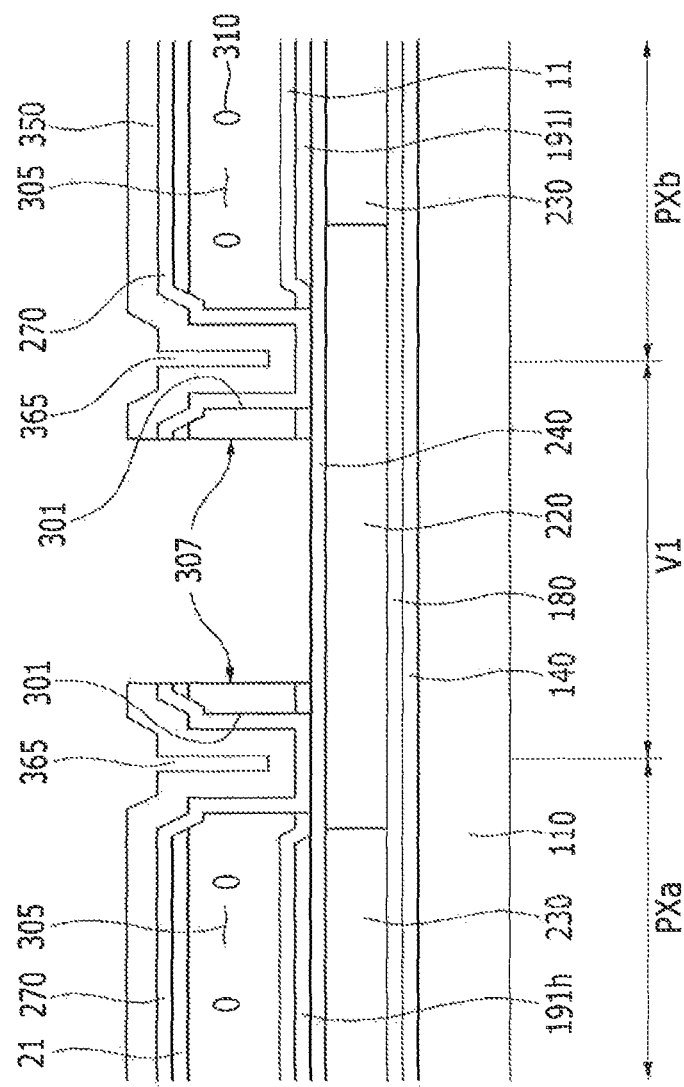

As illustrated in FIG. 26, the second insulating layer 350 positioned at the first valley V1 may be removed by patterning the second insulating layer 350. As a result, the second insulating layers 350 are formed to be connected to each other along a plurality of pixel rows. In this case, the patterned second insulating layer 350 functions as the mask in a subsequent etching step.

As illustrated in FIG. 26, the common electrode 270 is patterned by using the second insulating layer 350 as a mask to remove the common electrode 270 from the first valley V1.

In the present invention, since the lower structure is patterned by using the patterned second insulating layer 350 structure itself as a mask without additionally using a separate mask after forming the second insulating layer 350, the number of masks used in the manufacturing process may be reduced. Further, since the roof layer is not formed on the second insulating layer, the process may be further simplified.

The sacrificial layer 300 positioned in the first valley V1 is exposed outside by patterning the second insulating layer 350 and the common electrode 270.

Next, the sacrificial layer 300 is entirely removed by supplying a developer on the substrate 110 where the sacrificial layer 300 is exposed. The present invention is not limited thereto, and the sacrificial layer 300 may be removed by another method.

When the sacrificial layer 300 is removed, the microcavity 305 is generated in a site where the sacrificial layer 300 is positioned.

The pixel electrode 191 and the common electrode 270 are spaced apart from each other with the microcavity 305 therebetween, and the pixel electrode 191 and the roof layer 360 are spaced apart from each other with the microcavity 305 therebetween. The common electrode 270 and the roof layer 360 are formed to cover the upper surface and both sides of the microcavity 305.

The microcavity 305 is exposed outside through a portion where the roof layer 360 and the common electrode 270 are removed, which is called an injection hole 307. The injection hole 307 is formed along the first valley V1. For example, the injection holes 307 may be formed to face each other at the edges of the first subpixel area PXa and the second subpixel area PXb. For example, the injection holes 307 is formed in the lower edge of the first subpixel area PXa and the upper edge of the second subpixel area PXb to expose the side of the microcavity 305. Alternatively, the injection hole 307 may be formed along the second valley V2.

Next, when an aligning agent containing an alignment material is dropped on the substrate 110 by a spin coating method or an inkjet method, the aligning agent is injected into the microcavity 305 through the injection hole 307. When the aligning agent is injected into the microcavity 305 and then a curing process is performed, a solution component is evaporated and the alignment material remains on the inner wall of the microcavity 305.

Accordingly, the first alignment layer 11 is formed on the pixel electrode 191, and the second alignment layer 21 may be formed below the common electrode 270. The first alignment layer 11 and the second alignment layer 21 are formed to face each other with the microcavity 305 therebetween, and to be connected to each other at an edge of the pixel area PX.

The first and second alignment layers 11 and 21 are aligned in a vertical direction to the substrate 110, except for the side of the microcavity 305. In addition, a process of irradiating UV rays on the first and second alignment layers 11 and 21 is performed, and as a result, the first and second alignment layers 11 and 21 may be aligned in a horizontal direction to the substrate 110.

Next, when the liquid crystal material constituted by liquid crystal molecules 310 is dropped on the substrate 110 by an inkjet method or a dispensing method, the liquid crystal material is injected into the microcavity 305 through the injection hole 307. In this case, a liquid crystal material is dropped only in any one injection hole 307 of the injection hole 307 formed along the odd-numbered first valley V1 and the injection hole 307 formed along the even-numbered first valley V1. For example, when the support member 365 is formed to be adjacent to both sides of the odd-numbered first valley V1, the liquid crystal material is dropped in the even-numbered first valley V1, but is not dropped in the odd-numbered first valley V1. On the contrary, when the support member 365 is formed to be adjacent to both sides of the even-numbered first valley V1, the liquid crystal material is dropped in the odd-numbered first valley V1, but is not dropped in the even-numbered first valley V1.

When the liquid crystal material is dropped in the injection holes 307 formed along the odd-numbered first valleys V1, the liquid crystal material passes through the injection hole 307 by capillary force to be injected into the microcavity 305. In this case, the liquid crystal material is injected into the microcavity 305 well by discharging air in the microcavity 305 through the injection hole 307 formed along the even-numbered first valley V1.

Next, an overcoat 390 is formed by depositing a material which does not react with the liquid crystal molecules 310 on the second insulating layer. The overcoat 390 is formed to cover the injection hole 307 where the microcavity 305 is exposed outside to seal the microcavity 305.

Next, although not illustrated, polarizers may be attached onto the upper and lower surfaces of the display device. The polarizers may be configured by a first polarizer and a second polarizer. The first polarizer may be attached onto the lower surface of the substrate 110, and the second polarizer may be attached onto the overcoat 390.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A display device, comprising:
    a substrate including a thin film transistor;
    a pixel electrode connected to the thin film transistor;
    a common electrode formed on the pixel electrode;
    a microcavity including liquid crystal molecules, wherein the microcavity is interposed between the pixel electrode and the common electrode, and wherein the microcavity includes an injection hole;
    a roof layer formed on the common electrode, wherein the roof layer includes at least one protrusion;
    a support member formed under the at least one protrusion and in a column shape, wherein the support member is surrounded by the liquid crystal molecules, wherein the support member is proximate to the injection hole such that a roof layer region proximate to the injection hole is prevented from being sagged down; and
    an overcoat formed on the roof layer and a side of the microcavity, wherein the overcoat covers the injection hole and the support member.
2. The display device of claim 1, further comprising a light blockingmember formed on the thin film transistor, wherein the support member and the at least one protusion of the roof layer are formed on the light blocking member.

3. The display device of claim 2, wherein the support member is formed only in a region adjacent to one side of the microcavity.

4. The display device of claim 3, further comprising a step member interposed between the roof layer and the support member.

5. The display device of claim 1, wherein the support member includes a same material as the roof layer, and wherein a thickness of the roof layer is between about 5,000 Å and about 10,000 Å.

6. The display device of claim 1, further comprising an insulating layer interposed between the common electrode and the roof layer.

7. The display device of claim 6, wherein an edge of the roof layer coincides with a side of the insulating layer and a side of the common electrode.

8. The display device of claim 6, wherein the insulating layer includes an inorganic layer, and the roof layer includes an organic layer.

9. The display device of claim 6, wherein the insulating layer includes a protrusion disposed under the protrusion of the roof layer.

10. The display device of claim 1, wherein the support member is not overlapped with the pixel electrode.

11. The display device of claim 6, wherein the support member includes a same material as the insulating layer.

12. The display device of claim 6, wherein the support member, the insulating layer and the overcoat include a same material as each other.

13. The display device of claim 6, wherein a side of the insulating layer coincides with a side of the common electrode.

14. A display device, comprising:
a plurality of first valleys extending in a first direction;
a plurality of second valleys extending in a second direction crossing the first direction;
a plurality of microcavities arranged in a matrix form, wherein each microcavity is surrounded by at least one first valley and at least one second valley and each microcavity includes liquid crystal molecules, and wherein each microcavity of the plurality of microcavities includes an injection hole;
a plurality of support members arranged in the plurality of microcavities, wherein the plurality of support members is adjacent to both sides of odd-numbered first valleys of the plurality of first valleys, and wherein each support member of the support members is proximate to the corresponding injection hole such that a roof layer region proximate to the injection hole is prevented from being sagged down;
a roof layer formed on the plurality of microcavities, wherein the roof layer is further formed in the plurality of second valleys and is not formed in the plurality of first valley, and wherein the roof layer includes a plurality of protrusions protruding toward the odd-numbered first valleys;

each support member of the support members is proximate to the corresponding injection hole such that a roof layer region proximate to the injection hole is prevented from being sagged down; and
an overcoat formed on the roof layer and sides of each microcavity, wherein the overcoat covers the injection hole and the support member.

15. The display device of claim 14, wherein at least two support members of the plurality of support members are formed in a same side of each microcavity.

16. The display device of claim 14, wherein the plurality of microcavities includes at least one microcavity shared by at least two subpixels, wherein the at least two subpixels are arranged in the second direction.

17. A manufacturing method of a display device, comprising:
forming a thin film transistor on a substrate;
forming a pixel electrode connected to the thin film transistor;
forming a sacrificial layer on the pixel electrode;
forming an opening by removing a part of the sacrificial layer;
forming a common electrode on the sacrificial layer;
forming a roof layer on the common electrode;
forming a support member in the opening;
forming an injection hole by patterning the roof layer so that a part of the sacrificial layer is exposed;
removing the sacrificial layer by using the patterned roof layer as a mask to form a microcavity between the pixel electrode and the common electrode;
forming a liquid crystal layer in the microcavity by injecting a liquid crystal material through the injection hole, wherein the support member is proximate to the injection hole such that a roof layer region proximate to the injection hole is prevented from being sagged down; and
forming an overcoat on the roof layer to seal the microcavity, wherein the roof layer has a protrusion under which the support member is formed, wherein the overcoat covers the injection hole and the support member.

18. The manufacturing method of claim 17, wherein the support member is not overlapped with the pixel electrode, and an eave of the roof layer coincide with a side of the common electrode.

19. The manufacturing method of claim 17, further comprising:
forming an insulating layer between the common electrode and the roof layer, wherein the insulating layer has a protrusion which overlaps the protrusion of the roof layer.

20. The manufacturing method of claim 17, wherein the injection hole includes two facing injection holes, and wherein the injection of the liquid crystal material is performed at one of the two facing injection holes.

* * * * *